US012336385B2

(12) United States Patent
Kim et al.

(10) Patent No.: US 12,336,385 B2
(45) Date of Patent: Jun. 17, 2025

(54) DISPLAY DEVICE AND METHOD OF MANUFACTURING DISPLAY DEVICE

(71) Applicant: Samsung Display Co., Ltd., Yongin-Si (KR)

(72) Inventors: Keunwoo Kim, Seongnam-si (KR); Taewook Kang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 667 days.

(21) Appl. No.: 17/568,242

(22) Filed: Jan. 4, 2022

(65) Prior Publication Data

US 2022/0344424 A1    Oct. 27, 2022

(30) Foreign Application Priority Data

Apr. 22, 2021  (KR) .................. 10-2021-0052410

(51) Int. Cl.
    *H10K 59/121*    (2023.01)
    *H10K 59/12*     (2023.01)
    *H10K 59/131*    (2023.01)
    *H10K 71/00*     (2023.01)

(52) U.S. Cl.
    CPC ..... *H10K 59/1213* (2023.02); *H10K 59/1216* (2023.02); *H10K 59/131* (2023.02); *H10K 71/00* (2023.02); *H10K 59/1201* (2023.02)

(58) Field of Classification Search
    CPC ........... H10K 59/1213; H10K 59/1216; H10K 59/131; H10K 59/123; H10K 59/124; H01L 27/124
    See application file for complete search history.

(56) References Cited

U.S. PATENT DOCUMENTS

| 9,997,582 | B2* | 6/2018 | Lee .................. H10K 59/1216 |
| 2019/0165073 | A1 | 5/2019 | Jeong et al. |
| 2020/0027939 | A1* | 1/2020 | Cho ..................... G09G 3/3266 |
| 2020/0243635 | A1 | 7/2020 | Lee et al. |

(Continued)

FOREIGN PATENT DOCUMENTS

| CN | 112419972 A | 2/2021 |
| KR | 1020160105956 A | 9/2016 |
| KR | 1020190062651 A | 6/2019 |

(Continued)

*Primary Examiner* — Phat X Cao
(74) *Attorney, Agent, or Firm* — CANTOR COLBURN LLP

(57) ABSTRACT

A display device includes a substrate including a sub-pixel area, an active layer disposed in the sub-pixel area and including first to third regions, a first channel region between the first and second regions, and a second channel region between the second and third regions, a first gate electrode disposed in the first and second channel regions, and constituting a dual gate transistor together with the first and second regions, the first channel region, the second and third regions, and the second channel region, a first gate insulating layer disposed between the active layer and the first gate electrode, and defining an opening exposing the second region, an insulating pattern in the opening, a gate electrode pattern contacting a top surface of the insulating pattern, and is spaced apart from the first gate electrode, and a light emitting structure on the dual gate transistor and the gate electrode pattern.

11 Claims, 26 Drawing Sheets

(56) References Cited

U.S. PATENT DOCUMENTS

2021/0057502 A1    2/2021  Kim et al.
2021/0359058 A1*  11/2021  Cho ..................... H01L 27/124

FOREIGN PATENT DOCUMENTS

| KR | 1020200009171 A | 1/2020 |
| KR | 1020200015862 A | 2/2020 |
| KR | 1020200093718 A | 8/2020 |
| KR | 1020210022807 A | 3/2021 |

* cited by examiner

DISPLAY DEVICE AND METHOD OF MANUFACTURING DISPLAY DEVICE

This application claims priority to Korean Patent Application No. 10-2021-0052410, filed on Apr. 22, 2021, and all the benefits accruing therefrom under 35 U.S.C. § 119, the content of which in its entirety is herein incorporated by reference.

BACKGROUND

1. Field

Embodiments relate generally to a display device and a method of manufacturing a display device. More particularly, embodiments of the invention relate to a display device including a dual gate transistor and a method of manufacturing a display device including a dual gate transistor.

2. Description of the Related Art

Flat panel display devices are used as display devices for replacing a cathode ray tube display device due to lightweight and thin characteristics thereof. As representative examples of such flat panel display devices, there are a liquid crystal display device and an organic light emitting diode display device.

The display device may include at least one driving transistor, at least one switching transistor, and at least one storage capacitor. In this case, the driving transistor may have a relatively long channel region to ensure a driving range, and the switching transistor may have a relatively short channel region to reduce a charging time. In order for the display device to be driven at a low frequency, a switching transistor connected to a first terminal of the driving transistor is desired to reduce a leakage current. In this case, a data signal may be provided to a second terminal of the driving transistor. In addition, a first terminal of the switching transistor may be connected to a gate terminal of the driving transistor and the storage capacitor, and a second terminal of the switching transistor may be connected to the first terminal of the driving transistor. In order to reduce the leakage current, the switching transistor may be implemented as a dual gate transistor or a triple gate transistor.

SUMMARY

Embodiments provide a display device including a dual gate transistor.

Embodiments provide a method of manufacturing a display device including a dual gate transistor.

In an embodiment of the invention, a display device includes a substrate, an active layer, a first gate electrode, a first gate insulating layer, an insulating pattern, a gate electrode pattern, and a light emitting structure. The substrate includes a sub-pixel area. The active layer is disposed in the sub-pixel area on the substrate, and includes first, second, and third regions, a first channel region disposed between the first and second regions, and a second channel region disposed between the second and third regions. The first gate electrode is disposed in the first and second channel regions on the active layer, and constitutes a dual gate transistor together with the first and second regions and the first channel region and together with the second and third regions and the second channel region. The first gate insulating layer is disposed between the active layer and the first gate electrode, and defines an opening that exposes the second region of the active layer. The insulating pattern is disposed in the opening. The gate electrode pattern contacts a first surface of the insulating pattern opposite to a second surface of the insulating pattern facing the substrate, and is spaced apart from the first gate electrode. The gate electrode pattern constitutes a capacitor together with the second region. The light emitting structure is disposed on the dual gate transistor and the gate electrode pattern.

In an embodiment, the dual gate transistor may be connected in series.

In an embodiment, a dielectric constant of the insulating pattern may be greater than a dielectric constant of the first gate insulating layer.

In an embodiment, the display device may further include a second gate insulating layer, an inter-insulating layer, and a connection pattern. The second gate insulating layer may be disposed on the first gate electrode and the gate electrode pattern. The inter-insulating layer may be disposed on the second gate insulating layer. The connection pattern may be disposed on the inter-insulating layer, and a first power supply voltage may be applied to the connection pattern.

In an embodiment, the connection pattern may be connected to the gate electrode pattern through a contact hole defined in the second gate insulating layer and the inter-insulating layer.

In an embodiment, a gate signal may be applied to the first gate electrode, and a first power supply voltage may be provided to the gate electrode pattern.

In an embodiment, the active layer may further include a fourth region and a third channel region disposed between the third and fourth regions. The first region, the first channel region, the second region, the second channel region, the third region, the third channel region, and the fourth region may be sequentially arranged.

In an embodiment, the display device may further include a second gate electrode disposed in the third channel region on the active layer. The second gate electrode may constitute a driving transistor together with the third and fourth regions and the third channel region.

In an embodiment, the first gate electrode, the gate electrode pattern, and the second gate electrode may be disposed in a same layer.

In an embodiment, the display device may further include a third gate electrode, an inter-insulating layer, and a power supply wire. The third gate electrode may be disposed on the second gate electrode, and may constitute a storage capacitor together with the second gate electrode. The inter-insulating layer may be disposed on the third gate electrode. The power supply wire may be disposed on the inter-insulating layer, and a first power supply voltage is applied to power supply wire. The power supply wire may be connected to the third gate electrode through a contact hole defined in the inter-insulating layer. The first power supply voltage may be provided to the third gate electrode.

In an embodiment, the light emitting structure may include a first electrode, a light emitting layer disposed on the lower electrode, and a second electrode to which a second power supply voltage is applied.

In an embodiment of the invention, a display device includes a substrate, an active layer, a first gate electrode, a first gate insulating layer, a gate electrode pattern, and a light emitting structure. The substrate includes a sub-pixel area. The active layer is disposed in the sub-pixel area on the substrate, and includes first, second, and third regions, a first channel region disposed between the first and second regions, and a second channel region disposed between the second and third regions. The first gate electrode is disposed in the first and second channel regions on the active layer, and constitutes a dual gate transistor together with the first and second regions and the first channel region and together with the second and third regions and the second channel region. The first gate insulating layer is disposed between the active layer and the first gate electrode, and a groove is defined in the first gate insulating layer in the second region of the active layer. The gate electrode pattern overlaps the groove, and constitutes a capacitor together with the second region. The light emitting structure is disposed on the dual gate transistor and the gate electrode pattern.

In an embodiment, the gate electrode pattern may be disposed inside the groove, and may contact the first gate insulating layer.

In an embodiment, the display device may further include an insulating pattern disposed in the groove.

In an embodiment, the gate electrode pattern may contact a first surface of the insulating pattern opposite to a second surface of the insulating pattern facing the substrate.

In an embodiment, a method of manufacturing a display device is provided as follows. A substrate including a sub-pixel area is formed or provided. An active layer including first, second, third, and fourth regions, a first channel region disposed between the first and second regions, a second channel region disposed between the second and third regions, and a third channel region disposed between the third and fourth regions is formed or provided in the sub-pixel area on the substrate. A first gate insulating layer defining an opening that exposes the second region of the active layer is formed or provided. An insulating pattern is formed or provided in the opening. A first gate electrode in the first and second channel regions and a gate electrode pattern in the second region are simultaneously formed or disposed on the first gate insulating layer. A light emitting structure is formed or disposed on the first gate electrode and the gate electrode pattern.

In an embodiment, the forming of the first gate insulating layer defining the opening that exposes the second region of the active layer may include forming a preliminary first gate insulating layer on the active layer, forming a photoresist defining an opening that exposes the second region on the preliminary first gate insulating layer, and performing an etching process over the entire substrate.

In an embodiment, the forming of the insulating pattern in the opening may include arranging a mask defining an opening that overlaps the second region on the first gate insulating layer and performing a deposition process over of the entire substrate.

In an embodiment, a dielectric constant of the insulating pattern may be greater than a dielectric constant of the first gate insulating layer.

In an embodiment, the method may further include forming a second gate electrode in the third channel region on the active layer, which is performed simultaneously with the simultaneously forming of the first gate electrode in the first and second channel regions and the gate electrode pattern in the second region on the first gate insulating layer. The first gate electrode, the gate electrode pattern, and the second gate electrode may be disposed in a same layer.

Since the display device in the embodiments of the invention includes the gate electrode pattern disposed in the same layer as the first gate electrode and the second gate electrode, the distance between the gate electrode pattern and the second region may be relatively reduced, and the capacitance of the capacitor may be relatively increased. In addition, since the insulating pattern having a relatively high dielectric constant is interposed between the gate electrode pattern and the second region b, the capacitance of the capacitor may be further increased. Accordingly, the leakage current may be significantly reduced in the second region b, and the display device may be driven at a low frequency.

According to the method of manufacturing the display device of the embodiments of the invention, since the gate electrode pattern, the first gate electrode, and the second gate electrode are simultaneously formed or provided in the same process, a manufacturing cost of the display device may be relatively reduced.

BRIEF DESCRIPTION OF THE DRAWINGS

Embodiments may be understood in more detail from the following description taken in conjunction with the accompanying drawings.

DETAILED DESCRIPTION

Figure 1:
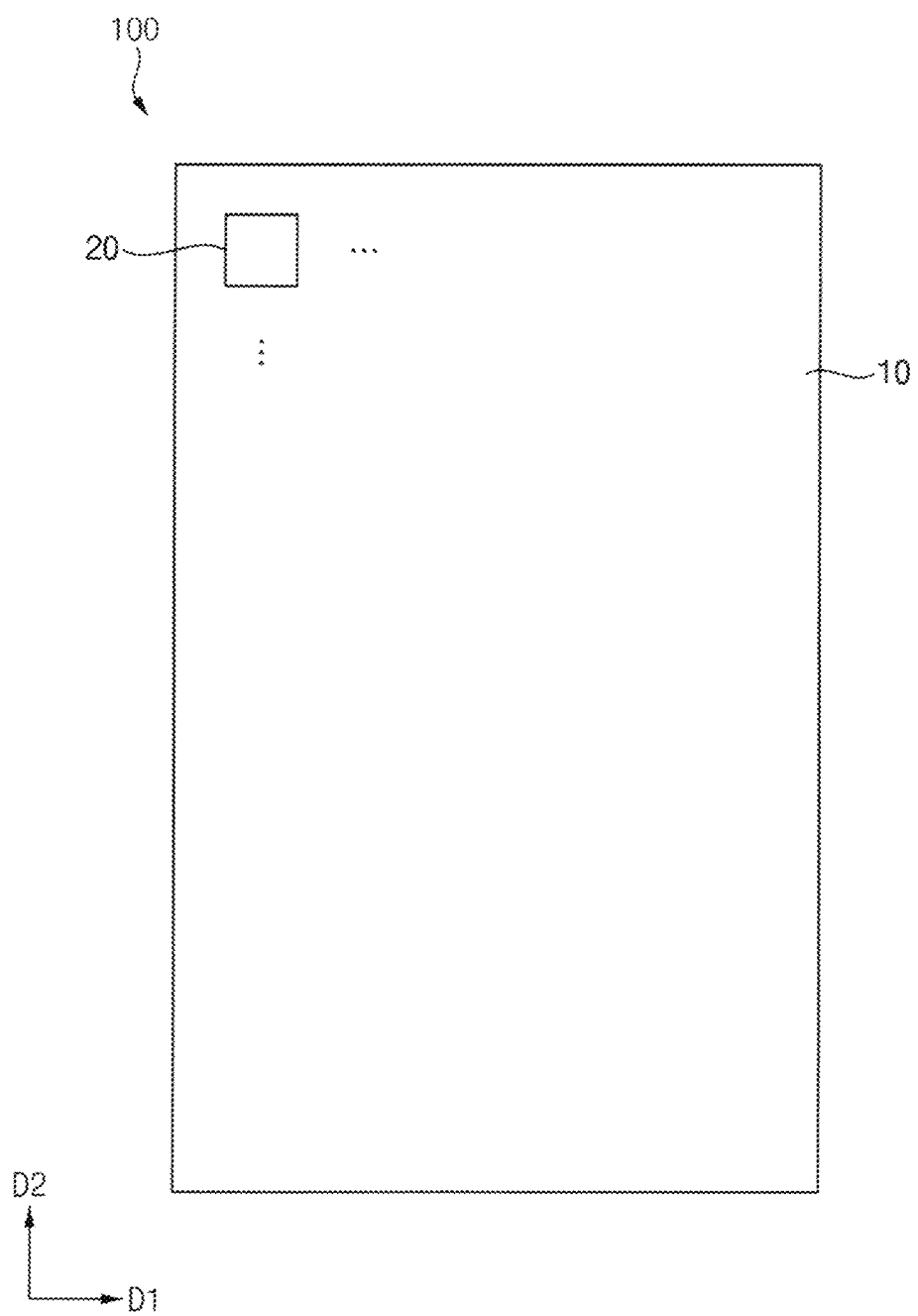
FIG. 1 is a plan view showing an embodiment of a display device according to the invention.

Hereinafter, display devices in embodiments of the invention and a method of manufacturing a display device in embodiments of the invention will be described in detail with reference to the accompanying drawings. In the accompanying drawings, same or similar reference numerals refer to the same or similar elements.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or"

includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a plan view showing an embodiment of a display device according to the invention.

Referring to FIG. 1, a display device 100 may include a display area 10, and the display area 10 may include a plurality of sub-pixel areas 20. The sub-pixel areas 20 may be arranged in a first direction D1, which is parallel to a top surface of the display device 100, and a second direction D2, which is substantially perpendicular to the first direction D1.

Sub-pixels (e.g., a sub-pixel SP of FIG. 2) may be disposed in the sub-pixel areas 20, respectively. Each of the sub-pixels may include a sub-pixel circuit (e.g., a sub-pixel circuit SPC of FIG. 2) and an organic light emitting diode (e.g., an organic light emitting diode OLED of FIG. 2). In this case, the organic light emitting diode may be disposed on the sub-pixel circuit. An image may be displayed in the display area 10 through the sub-pixels.

In an embodiment, the sub-pixels may include first, second, and third sub-pixels, for example. In an embodiment, the first sub-pixel may include a first organic light emitting diode for emitting a red light and a first sub-pixel circuit, the second sub-pixel may include a second organic light emitting diode for emitting a green light and a second sub-pixel circuit, and the third sub-pixel may include a third organic light emitting diode for emitting a blue light and a third sub-pixel circuit.

In an embodiment, the first organic light emitting diode may overlap the first sub-pixel circuit, the second organic light emitting diode may overlap the second sub-pixel circuit, and the third organic light emitting diode may overlap the third sub-pixel circuit. In some embodiments, the first organic light emitting diode may overlap a portion of the first sub-pixel circuit and a portion of a sub-pixel circuit other than the first sub-pixel circuit, the second organic light emitting diode may overlap a portion of the second sub-pixel circuit and a portion of a sub-pixel circuit other than the second sub-pixel circuit, and the third organic light emitting diode may overlap a portion of the third sub-pixel circuit and a portion of a sub-pixel circuit other than the third sub-pixel circuit. In an embodiment, the first to third organic light emitting diodes may be arranged by an RGB stripe scheme in which rectangles having the same size as each other are sequentially arranged, an S-stripe scheme including a blue organic light emitting diode having a relatively large area, a WRGB scheme further including a white organic light emitting diode, a PenTile (PENTILE™) scheme in which RG-GB patterns are repeatedly arranged, or the like, for example.

In addition, the sub-pixel circuit may include at least one driving transistor, at least one switching transistor, at least one capacitor, or the like. In an embodiment, the sub-pixel circuit may include one driving transistor (e.g., a first transistor TR1 of FIG. 2), at least eight switching transistors (e.g., second to seventh transistors TR2, TR3_1, TR3_2, TR4_1, TR4_2, TR5, TR6, and TR7 of FIG. 2), one storage capacitor (e.g., a storage capacitor CST of FIG. 2), a capacitor (a capacitor CAP of FIG. 2), or the like.

However, although the display device 100 (or the display area 10 and each of the sub-pixel areas 20) has been shown as having a quadrangular (e.g., rectangular) shape, the shape of the display device 100 is not limited thereto. In an embodiment, the display device 100 may have a triangular shape, a rhombic shape, a polygonal shape, a track shape, a circular shape, or an elliptical shape in a plan view, for example.

Figure 2:
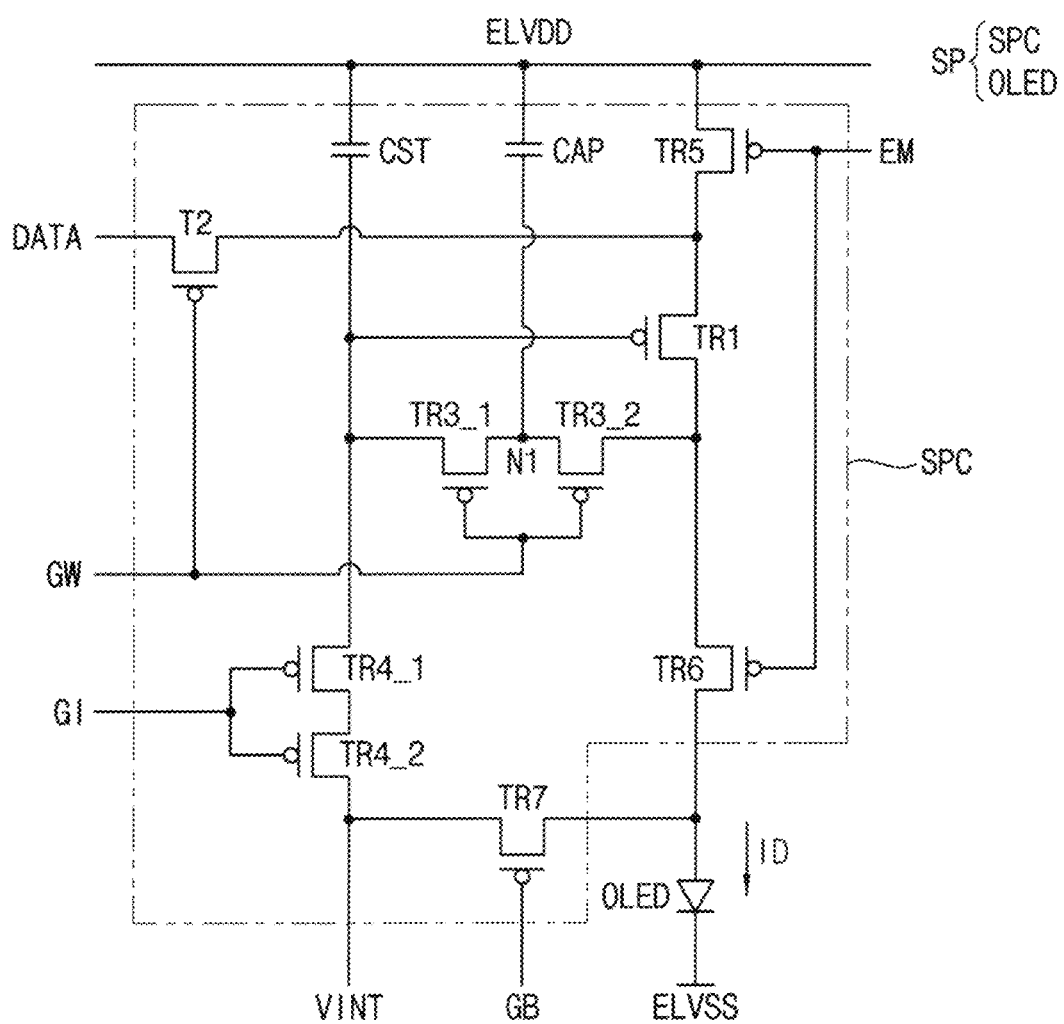
FIG. 2 is a circuit diagram showing a sub-pixel disposed in a sub-pixel area of FIG. 1.

FIG. 2 is a circuit diagram showing a sub-pixel disposed in a sub-pixel area of FIG. 1.

Referring to FIG. 2, a sub-pixel SP may be disposed in each of the sub-pixel areas 20 of the display device 100. The sub-pixel SP may include a sub-pixel circuit SPC and an organic light emitting diode OLED. In this case, the sub-pixel circuit SPC may include first to seventh transistors TR1, TR2, TR3_1, TR3_2, TR4_1, TR4_2, TR5, TR6, and TR7, a storage capacitor CST, a capacitor CAP, wires, or the like, and the wires may include a wire to which a first power supply voltage ELVDD is applied, a wire to which a second power supply voltage ELVSS is applied, a wire to which an initialization voltage VINT is applied, a wire to which a data signal DATA is applied, a wire to which a gate signal GW is applied, a wire to which a gate initialization signal GI is applied, a wire to which an emission control signal EM is applied, a wire to which a diode initialization signal GB is applied, or the like. In addition, the sub-pixel circuit SPC may further include an active layer (e.g., an active layer 130 of FIG. 3) which connects the first to seventh transistors TR1, TR2, TR3_1, TR3_2, TR4_1, TR4_2, TR5, TR6, and TR7, the storage capacitor CST, the capacitor CAP, or the like to each other.

The first transistor TR1 may correspond to a driving transistor, and the second to seventh transistors TR2, TR3_1, TR3_2, TR4_1, TR4_2, TR5, TR6, and TR7 may correspond to switching transistors. Each of the first to seventh transistors TR1, TR2, TR3_1, TR3_2, TR4_1, TR4_2, TR5, TR6, and TR7 may include a first terminal, a second terminal, a channel, and a gate terminal. In an embodiment, the first terminal may be a source terminal, and the second terminal may be a drain terminal. In some embodiments, the first terminal may be a drain terminal, and the second terminal may be a source terminal.

The organic light emitting diode OLED (e.g., corresponding to a light emitting structure 200 of FIG. 9) may output a light based on a driving current ID. The organic light emitting diode OLED may include a first terminal and a second terminal. In an embodiment, the second terminal of the organic light emitting diode OLED may receive the second power supply voltage ELVSS, for example. In an embodiment, the first terminal of the organic light emitting diode OLED may be an anode terminal, and the second terminal of the organic light emitting diode OLED may be a cathode terminal, for example. In some embodiments, the first terminal of the organic light emitting diode may be a cathode terminal, and the second terminal of the organic light emitting diode OLED may be an anode terminal. In an embodiment, the anode terminal of the organic light emitting diode OLED may correspond to a lower electrode 290 of FIG. 9, and the cathode terminal of the organic light emitting diode OLED may correspond to an upper electrode 340 of FIG. 9.

The first transistor TR1 (e.g., corresponding to a driving transistor 250 shown in FIG. 9) may generate the driving current ID. In an embodiment, the first transistor TR1 may operate in a saturation region. In this case, the first transistor TR1 may generate the driving current ID based on a voltage difference between the gate terminal and the source terminal of the first transistor TR1. In addition, gray levels may be expressed based on a magnitude of the driving current ID supplied to the organic light emitting diode OLED. In some embodiments, the first transistor TR1 may operate in a linear region. In this case, the gray levels may be expressed based on a sum of a time during which the driving current ID is supplied to the organic light emitting diode OLED within one frame.

The gate terminal of the second transistor TR2 may receive the gate signal GW. The first terminal of the second transistor TR2 may receive the data signal DATA. The second terminal of the second transistor TR2 may be connected to the first terminal of the first transistor TR1. The second transistor TR2 may supply the data signal DATA to the first terminal of the first transistor TR1 during an activation period of the gate signal GW. In this case, the second transistor TR2 may operate in a linear region.

The third transistors TR3_1 and TR3_2 (e.g., corresponding to a dual gate transistor DGT shown in FIG. 9) may be connected in series, and may operate as a dual gate transistor. In an embodiment, the same signal may be applied to the gate terminals of the third transistors TR3_1 and TR3_2, for example. In other words, the gate terminals of the third transistors TR3_1 and TR3_2 may receive the gate signal GW. In addition, the second terminal of the third transistor TR3_1 and the first terminal of the third transistor TR3_2 may be connected to each other. Moreover, when the dual gate transistor is turned off, a leakage current may be reduced. The first terminal of the third transistor TR3_1 may be connected to the gate terminal of the first transistor TR1. The second terminal of the third transistor TR3_2 may be connected to the second terminal of the first transistor TR1. According to other embodiments, the third transistors TR3_1 and TR3_2 may be implemented as a triple gate transistor including three transistors.

Each of the third transistors TR3_1 and TR3_2 may connect the gate terminal of the first transistor TR1 to the second terminal of the first transistor TR1 during the activation period of the gate signal GW. In this case, each of the third transistors TR3_1 and TR3_2 may operate in a linear region. In other words, each of the third transistors TR3_1 and TR3_2 may diode-connect the first transistor TR1 during the activation period of the gate signal GW. Since the first transistor TR1 is diode-connected, a voltage difference corresponding to a threshold voltage of the first transistor TR1 may occur between the first terminal of the first transistor TR1 and the gate terminal of the first transistor TR1. As a result, a voltage obtained by summing up a voltage of the data signal DATA supplied to the first terminal of the first transistor TR1 and the voltage difference (i.e., the threshold voltage) may be supplied to the gate terminal of the first transistor TR1 during the activation period of the gate signal GW. In other words, the data signal DATA may be compensated for by the threshold voltage of the first transistor TR1, and the compensated data signal DATA may be supplied to the gate terminal of the first transistor TR1.

The fourth transistors TR4_1 and TR4_2 may be connected in series, and may operate as a dual gate transistor. In an embodiment, the same signal may be applied to the gate terminals of the fourth transistors TR4_1 and TR4_2, for example. In other words, the gate terminals of the fourth transistors TR4_1 and TR4_2 may receive the gate initialization signal GI. In addition, the first terminal of the fourth transistor TR4_1 and the second terminal of the fourth transistor TR4_2 may be connected to each other. Moreover, when the dual gate transistor is turned off, a leakage current may be reduced. The second terminal of the fourth transistor TR4_1 may be connected to the gate terminal of the first transistor TR1 and a first terminal of the storage capacitor CST. The first terminal of the fourth transistor TR4_2 may receive the initialization voltage VINT. According to other embodiments, the fourth transistors TR4_1 and TR4_2 may be implemented as a triple gate transistor including three transistors.

Each of the fourth transistors TR4_1 and TR4_2 may supply the initialization voltage VINT to the gate terminal of the first transistor TR1 during an activation period of the gate initialization signal GI. In this case, each of the fourth transistors TR4_1 and TR4_2 may operate in a linear region. In other words, each of the fourth transistors TR4_1 and TR4_2 may initialize the gate terminal of the first transistor TR1 to the initialization voltage VINT during the activation period of the gate initialization signal GI.

In an embodiment, the gate initialization signal GI may be substantially the same as the gate signal GW of one horizontal time before. In an embodiment, a gate initialization signal GI supplied to a sub-pixel SP in an $n^{th}$ row (where n is an integer greater than or equal to 2) among a plurality of sub-pixels SP included in the display device 100 may be a signal that is substantially the same as a gate signal GW supplied to a sub-pixel SP in an $(n-1)^{th}$ row among the sub-pixels SP, for example. In other words, an activated gate signal GW may be supplied to the sub-pixel SP in the $(n-1)^{th}$ row among the sub-pixels SP, so that an activated gate initialization signal GI may be supplied to the sub-pixel SP in the $n^{th}$ row among the sub-pixels SP. As a result, the data signal DATA may be supplied to the sub-pixel SP in the $(n-1)^{th}$ row among the sub-pixels SP, and simultaneously, the gate terminal of the first transistor TR1 included in the sub-pixel SP in the n$^{th}$ row among the sub-pixels SP may be initialized to the initialization voltage VINT.

The gate terminal of the fifth transistor TR5 may receive the emission control signal EM. The first terminal of the fifth transistor TR5 may receive the first power supply voltage ELVDD. The second terminal of the fifth transistor TR5 may be connected to the first terminal of the first transistor TR1.

The fifth transistor TR5 may supply the first power supply voltage ELVDD to the first terminal of the first transistor TR1 during an activation period of the emission control signal EM. On the contrary, the fifth transistor TR5 may cut off the supply of the first power supply voltage ELVDD during an inactivation period of the emission control signal EM. In this case, the fifth transistor TR5 may operate in a linear region. Since the fifth transistor TR5 supplies the first power supply voltage ELVDD to the first terminal of the first transistor TR1 during the activation period of the emission control signal EM, the first transistor TR1 may generate the driving current ID. In addition, since the fifth transistor TR5 cuts off the supply of the first power supply voltage ELVDD during the inactivation period of the emission control signal EM, the data signal DATA supplied to the first terminal of the first transistor TR1 may be supplied to the gate terminal of the first transistor TR1.

The gate terminal of the sixth transistor TR6 may receive the emission control signal EM. The first terminal of the sixth transistor TR6 may be connected to the second terminal of the first transistor TR1. The second terminal of the sixth transistor TR6 may be connected to the first terminal of the organic light emitting diode OLED.

The sixth transistor TR6 may supply the driving current ID generated by the first transistor TR1 to the organic light emitting diode OLED during the activation period of the emission control signal EM. In this case, the sixth transistor TR6 may operate in a linear region. In other words, since the sixth transistor TR6 supplies the driving current ID generated by the first transistor TR1 to the organic light emitting diode OLED during the activation period of the emission control signal EM, the organic light emitting diode OLED may output the light. In addition, since the sixth transistor TR6 electrically separates the first transistor TR1 and the organic light emitting diode OLED from each other during the inactivation period of the emission control signal EM, the data signal DATA supplied to the second terminal of the first transistor TR1 (precisely, a data signal that has been subject to threshold voltage compensation) may be supplied to the gate terminal of the first transistor TR1.

The gate terminal of the seventh transistor TR7 may receive the diode initialization signal GB. The first terminal of the seventh transistor TR7 may receive the initialization voltage VINT. The second terminal of the seventh transistor TR7 may be connected to the first terminal of the organic light emitting diode OLED.

The seventh transistor TR7 may supply the initialization voltage VINT to the first terminal of the organic light emitting diode OLED during an activation period of the diode initialization signal GB. In this case, the seventh transistor TR7 may operate in a linear region. In other words, the seventh transistor TR7 may initialize the first terminal of the organic light emitting diode OLED to the initialization voltage VINT during the activation period of the diode initialization signal GB.

In some embodiments, the gate initialization signal GI and the diode initialization signal GB may be substantially the same signal. An operation of initializing the gate terminal of the first transistor TR1 and an operation of initializing the first terminal of the organic light emitting diode OLED may not affect each other. In other words, the operation of initializing the gate terminal of the first transistor TR1 and the operation of initializing the first terminal of the organic light emitting diode OLED may be independent of each other.

The storage capacitor CST may include a first terminal and a second terminal. The storage capacitor CST may be connected between a first power supply voltage (ELVDD) wire and the gate terminal of the first transistor TR1. In an embodiment, the first terminal of the storage capacitor CST may be connected to the gate terminal of the first transistor TR1, and the second terminal of the storage capacitor CST may be connected to the first power supply voltage (ELVDD) wire, for example. The storage capacitor CST may maintain a voltage level of the gate terminal of the first transistor TR1 during an inactivation period of the gate signal GW. The inactivation period of the gate signal GW may include the activation period of the emission control signal EM, and the driving current ID generated by the first transistor TR1 may be supplied to the organic light emitting diode OLED during the activation period of the emission control signal EM. Therefore, the driving current ID generated by the first transistor TR1 may be supplied to the organic light emitting diode OLED based on the voltage level maintained by the storage capacitor CST.

The capacitor CAP may include a first terminal and a second terminal. The capacitor CAP may be connected between the first power supply voltage (ELVDD) wire and the third transistors TR3_1 and TR3_2 (e.g., to a first node N1). In an embodiment, the first terminal of the capacitor CAP may be connected to the second terminal of the third transistor TR3_1 and the first terminal of the third transistor TR3_2, and the second terminal of the capacitor CAP may be connected to the first power supply voltage (ELVDD) wire, for example.

A gate signal (GW) wire, a gate initialization signal (GI) wire, a data signal (DATA) wire, or the like may be disposed at a periphery of the first node N1, and a voltage of the first node N1 may fluctuate due to voltage variations of the gate signal (GW) wire, the gate initialization signal (GI) wire, and the data signal (DATA) wire. In an embodiment, the first node N1 and the capacitor CAP may be connected to each other, so that a voltage fluctuation at the first node N1 that may be caused by the voltage variations of the gate signal (GW) wire, the gate initialization signal (GI) wire, and the data signal (DATA) wire disposed at the periphery of the first node N1 may be reduced.

In addition, when the inactivation period of the gate signal GW starts after the activation period of the gate signal GW ends, the voltage of the first node N1 may be increased, and a voltage between the first and second terminals of each of the third transistors TR3_1 and TR3_2 may be increased, so that a voltage of the gate terminal of the first transistor TR1 may also be increased. In this case, a flicker phenomenon in which a luminance of the organic light emitting diode OLED is reduced may occur. In an embodiment, since the first node N1 and the capacitor CAP are connected to each other, the voltage between the first and second terminals of each of the third transistors TR3_1 and TR3_2 may be reduced, so that the flicker phenomenon may not occur.

However, although the sub-pixel SP has been described as including one driving transistor, two dual gate transistors, four switching transistors, one storage capacitor, one capacitor, or the like, the configuration of the invention is not limited thereto. In an embodiment, the sub-pixel SP may include one driving transistor, at least one dual gate transistor, at least one switching transistor, at least one storage capacitor, and one capacitor CAP, for example.

Figure 4:
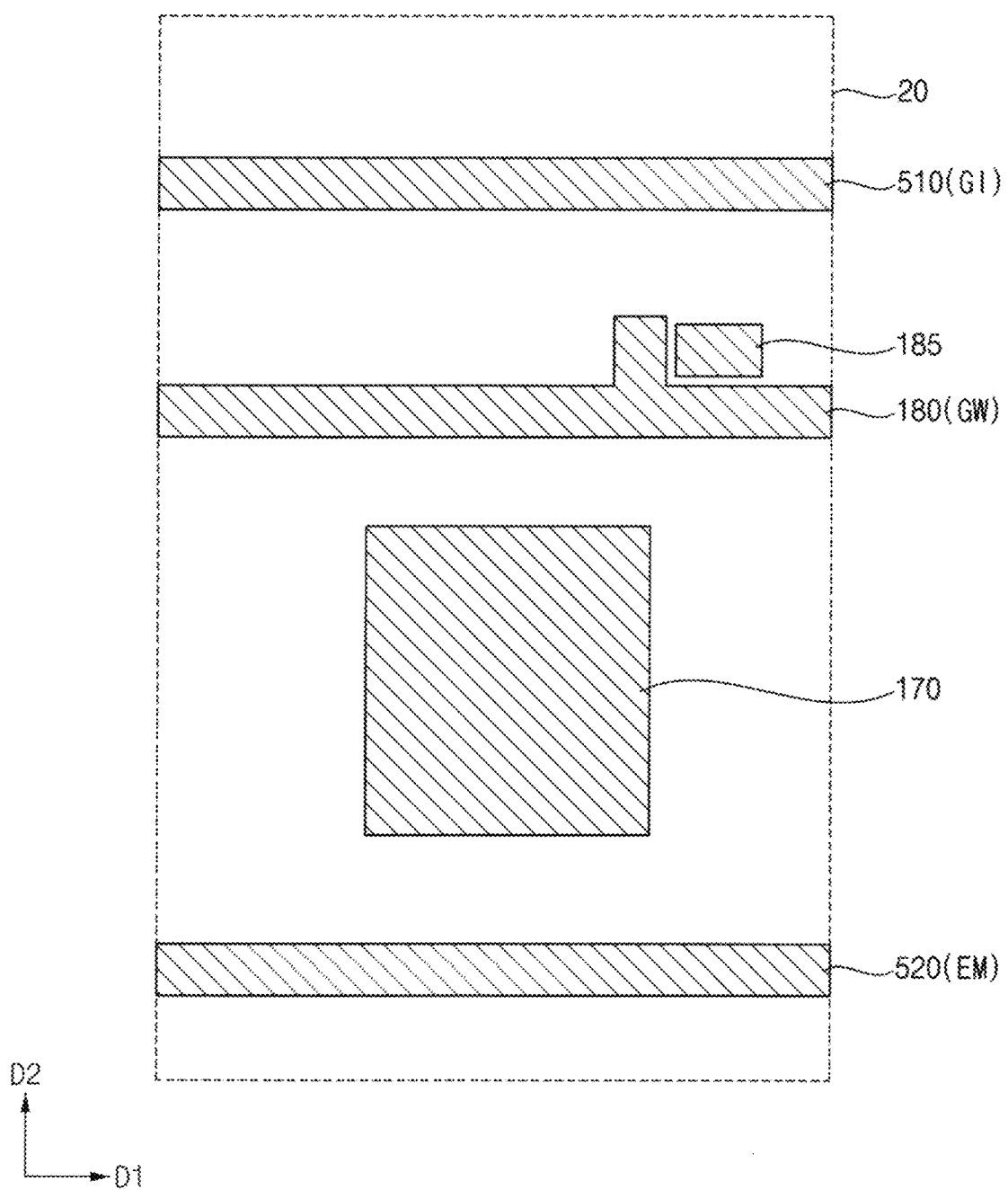
Figure 5:
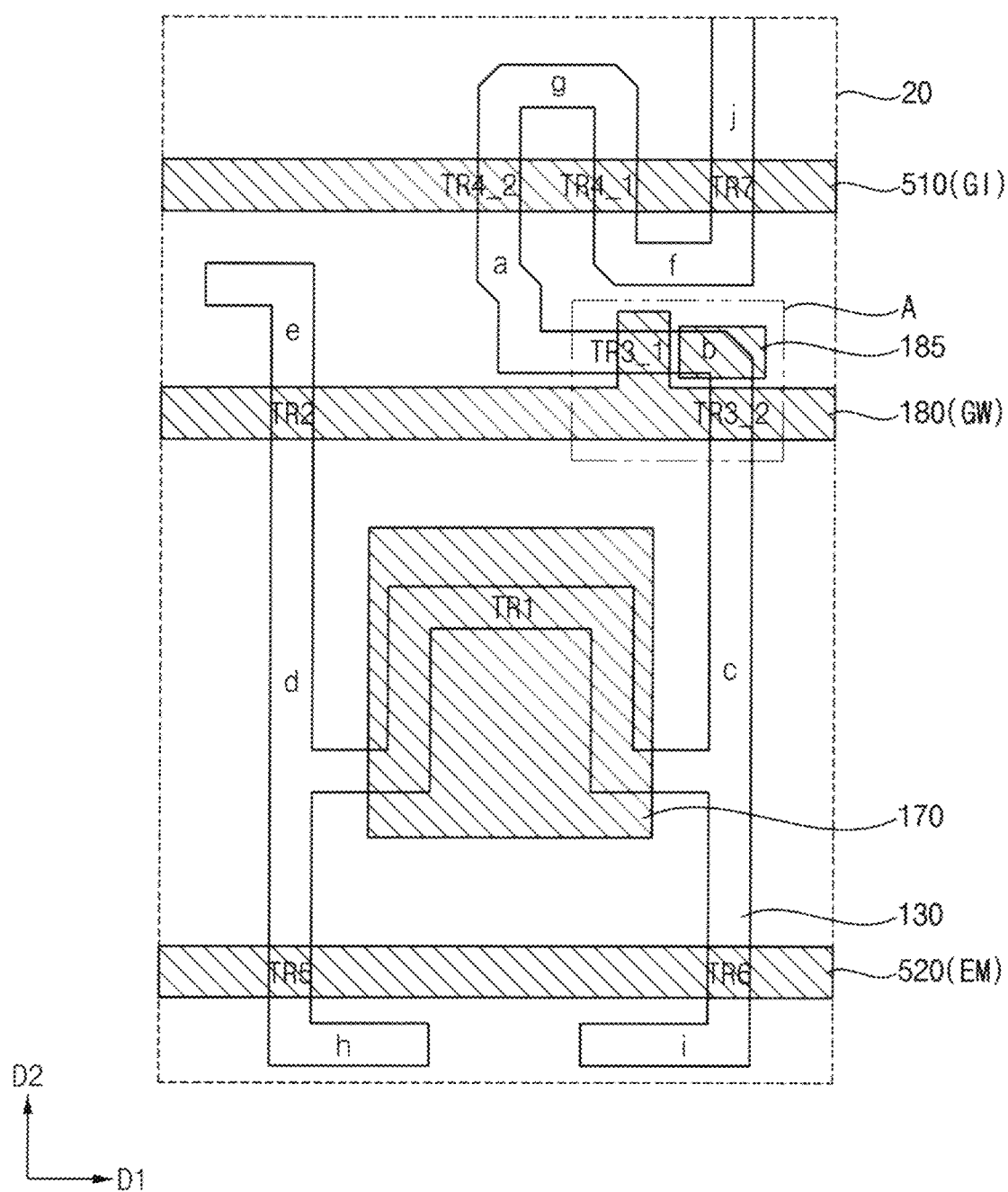
Figure 6:
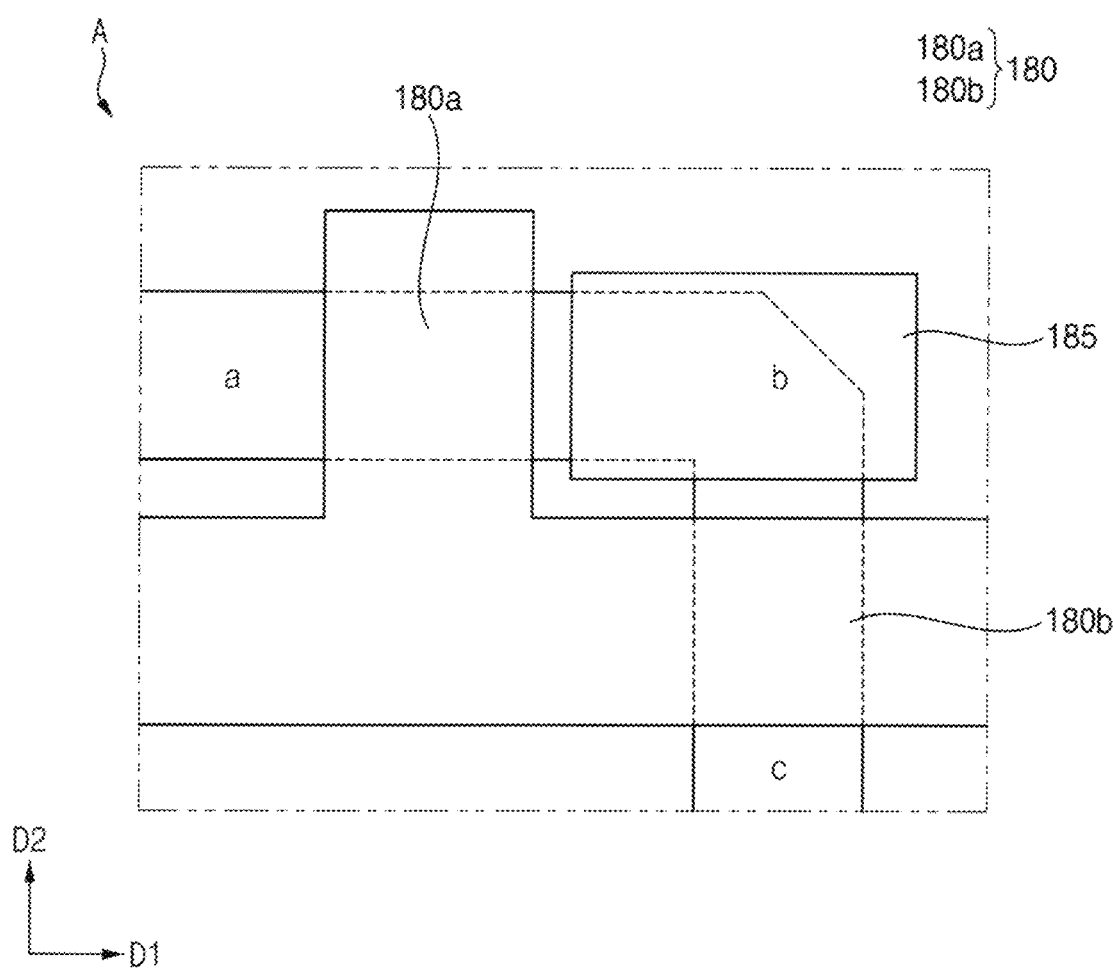

FIGS. 3 to 8 are plan views for describing the display device of FIG. 1. In an embodiment, the first to seventh transistors TR1, TR2, TR3_1, TR3_2, TR4_1, TR4_2, TR5, TR6, and TR7, the storage capacitor CST, the capacitor CAP, the wire to which the initialization voltage VINT is applied, the wire to which the gate signal GW is applied, the wire to which the gate initialization signal GI is applied, and the wire to which the emission control signal EM is applied, which are shown in FIG. 2, are shown in a layout. For convenience of description, not all components included in the display device 100 may be shown in FIGS. 3 to 8. In this case, FIG. 6 is a partially enlarged plan view showing a region A of FIG. 5.

Referring to FIGS. 3, 4, 5, and 6, the display device 100 may include a substrate (e.g., a substrate 110 of FIG. 9), an active layer 130, a first gate electrode 180, a second gate electrode 170, a gate electrode pattern 185, a gate initialization wire 510, an emission control signal wire 520, or the like.

Figure 3:
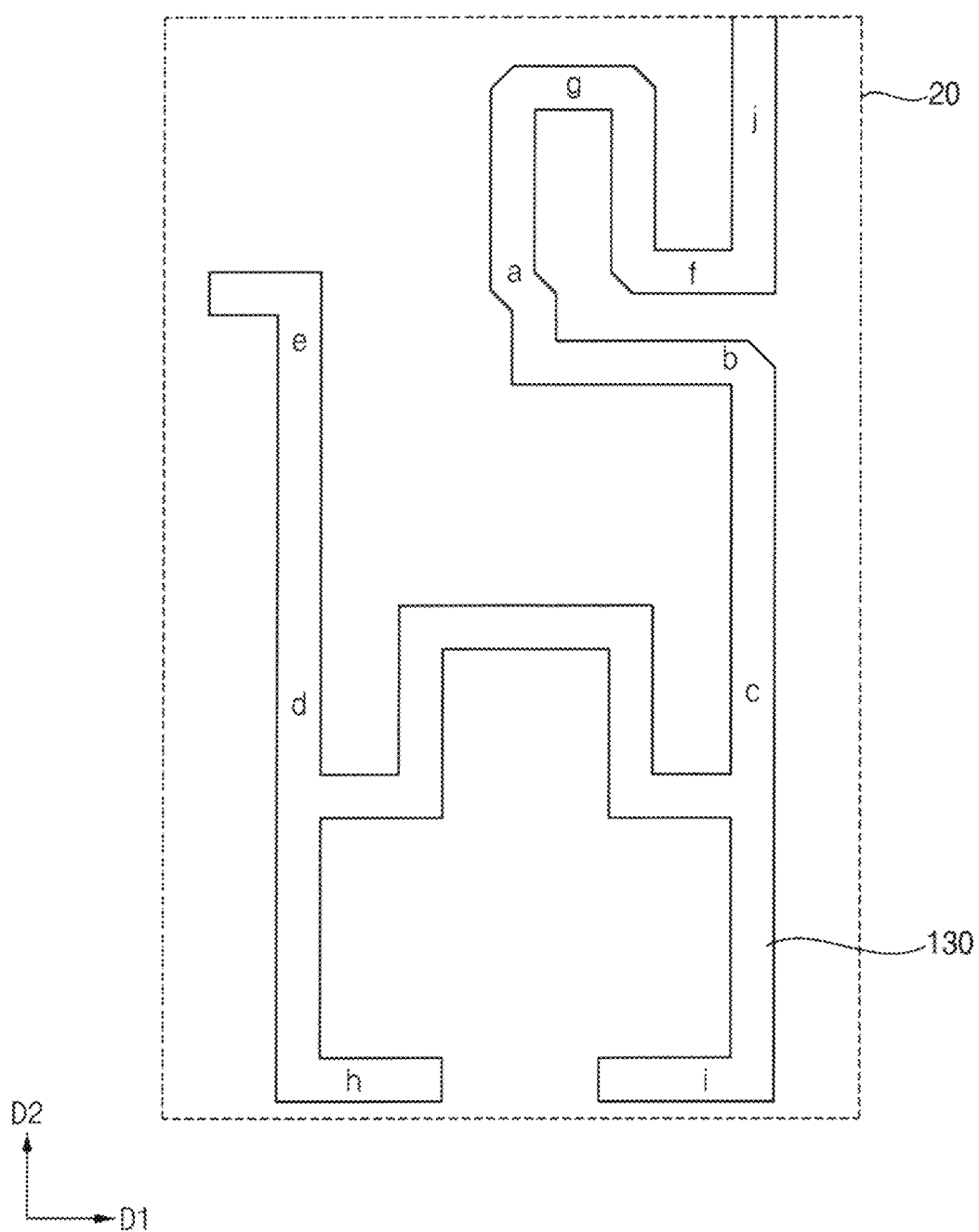
FIGS. 3 to 8 are plan views for describing the display device of FIG. 1.

As shown in FIG. 3, the active layer 130 may be disposed in the sub-pixel area 20 on the substrate. The active layer 130 may include first to tenth regions a, b, c, d, e, f, g, h, i, and j (e.g., regions where the active layer 130 does not overlap the first gate electrode 180, the second gate electrode 170, the gate initialization wire 510, and the emission control signal wire 520). The first to tenth regions a, b, c, d, e, f, g, h, i, and j may be doped with impurities (or ions), and may have relatively high electrical conductivities. The first to tenth regions a, b, c, d, e, f, g, h, i, and j may indicate regions constituting the source electrodes or the drain electrodes of the first to seventh transistors TR1, TR2, TR3_1, TR3_2, TR4_1, TR4_2, TR5, TR6, and TR7, in which a boundary between the regions may not be clearly distinguished, and the regions may be electrically connected to each other.

As shown in FIGS. 4 and 5, the first gate electrode 180, the second gate electrode 170, the gate electrode pattern 185, the gate initialization wire 510, and the emission control signal wire 520 may be disposed on the active layer 130.

The first gate electrode 180 may extend in the first direction D1, and may have a protrusion protruding in the second direction D2 between the first region a and the second region b. The protrusion of the first gate electrode 180 may constitute the third transistor TR3_1 together with the first region a and the second region b, and the first gate electrode 180 may constitute the third transistor TR3_2 together with the second region b and the third region c. The first gate electrode 180 may function as the wire to which the gate signal GW is applied, which is shown in FIG. 2. In other words, the gate signal GW may be applied to the third transistors TR3_1 and TR3_2, and the third transistors TR3_1 and TR3_2 may function as a dual gate transistor. A first portion of the first gate electrode 180 (or a portion of the protrusion of the first gate electrode 180) overlapping the channel of the third transistor TR3_1 may be defined as a first sub-gate electrode 180a, and a second portion of the first gate electrode 180 overlapping the channel of the third transistor TR3_2 may be defined as a second sub-gate electrode 180b (refer to FIG. 6).

In addition, the first gate electrode 180 may constitute the second transistor TR2 together with the fourth region d and the fifth region e.

The second gate electrode 170 may have an island shape. The second gate electrode 170 may constitute the first transistor TR1 (e.g., the driving transistor 250 of FIG. 9) together with the third region c and the fourth region d.

The gate initialization wire 510 may extend in the first direction D1. The gate initialization wire 510 may constitute the fourth transistor TR4_1 together with the sixth region f and the seventh region g, and the gate initialization wire 510 may constitute the fourth transistor TR4_2 together with the seventh region g and the first region a. The gate initialization wire 510 may function as the wire to which the gate initialization signal GI is applied, which is shown in FIG. 2. In other words, the gate initialization signal GI may be applied to the fourth transistors TR4_1 and TR4_2, and the fourth transistors TR4_1 and TR4_2 may function as a dual gate transistor.

In addition, the gate initialization wire 510 may constitute the seventh transistor TR7 together with the sixth region f and the tenth region j.

The emission control signal wire 520 may extend in the first direction D1. The emission control signal wire 520 may constitute the fifth transistor TR5 together with the fourth region d and the eighth region h, and the emission control signal wire 520 may constitute the sixth transistor TR6 together with the third region c and the ninth region i.

The gate electrode pattern 185 may be disposed on the second region b. In an embodiment, the second region b may correspond to the first node N1 of FIG. 2. In other words, the gate electrode pattern 185 may constitute the capacitor CAP together with the second region b.

Figure 7:
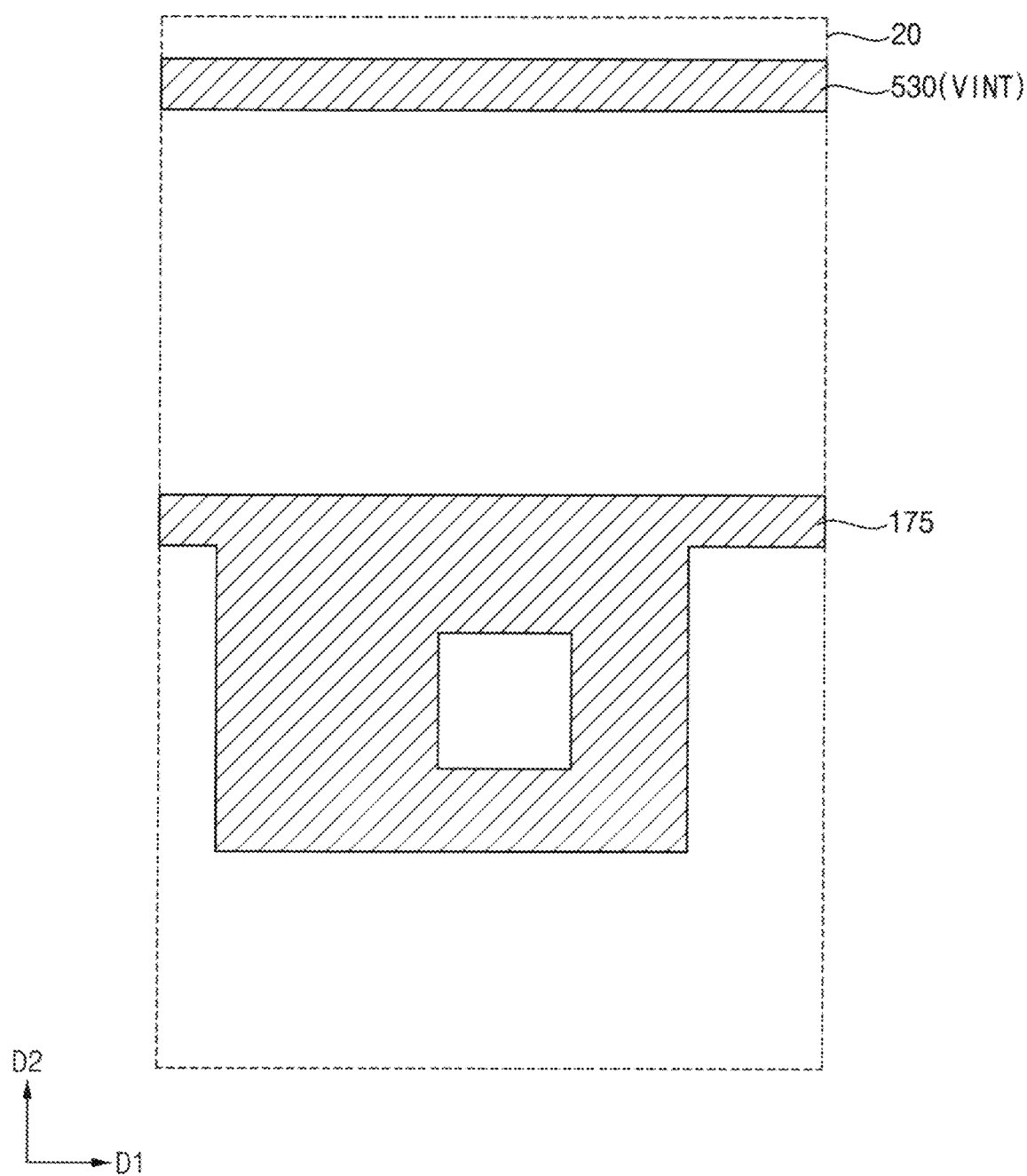
Figure 8:
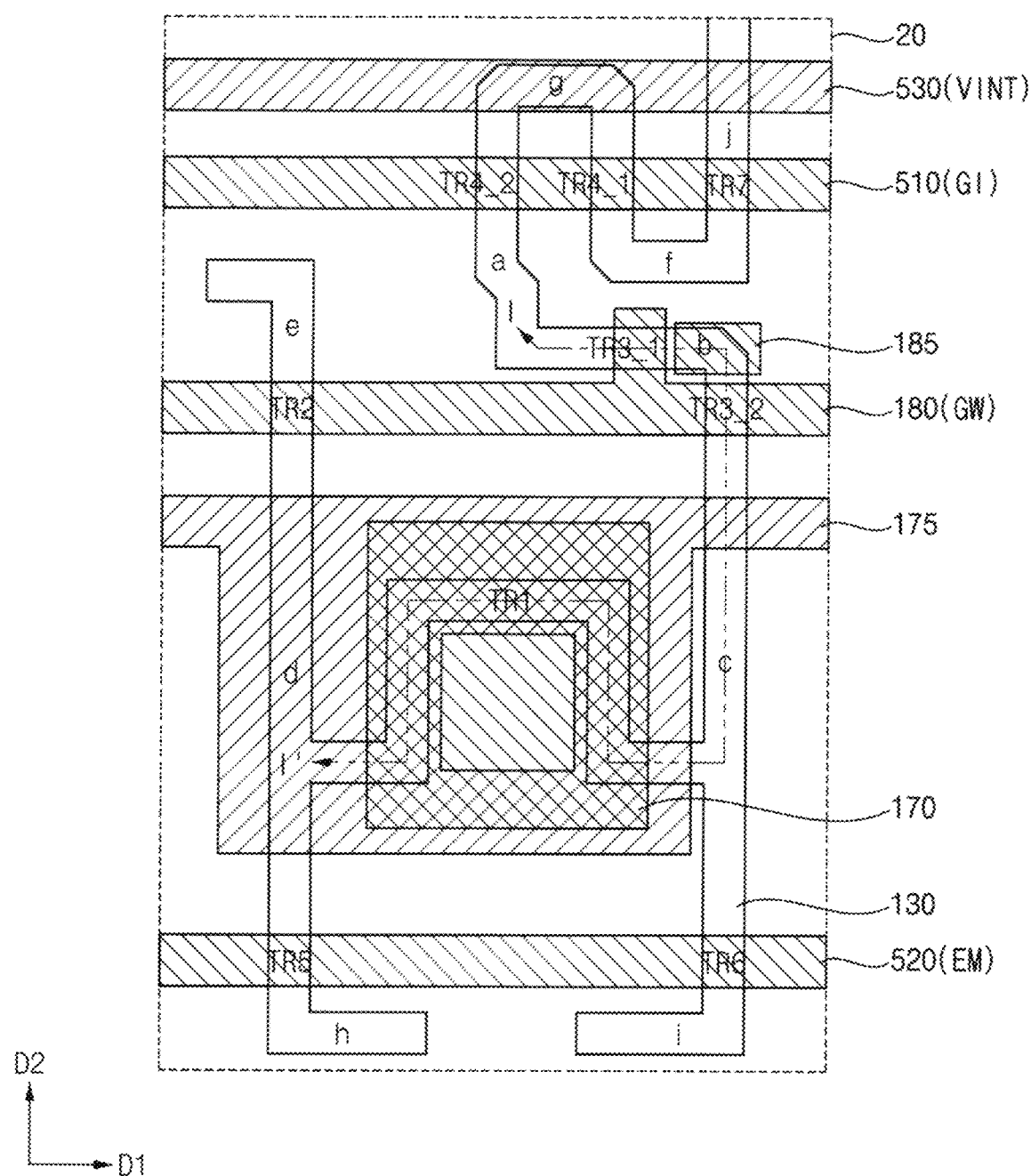

Referring to FIGS. 7 and 8, the display device 100 may further include an initialization voltage wire 530 and a third gate electrode 175.

The initialization voltage wire 530 and the third gate electrode 175 may be disposed on the first gate electrode 180, the second gate electrode 170, the gate electrode pattern 185, the gate initialization wire 510, and the emission control signal wire 520.

The initialization voltage wire 530 may extend in the first direction D1. The initialization voltage wire 530 may function as the wire to which the initialization voltage VINT is applied, which is shown in FIG. 2.

The third gate electrode 175 may extend in the first direction D1. The third gate electrode 175 may overlap the second gate electrode 170. The third gate electrode 175 may constitute the storage capacitor CST together with the second gate electrode 170.

Figure 9:
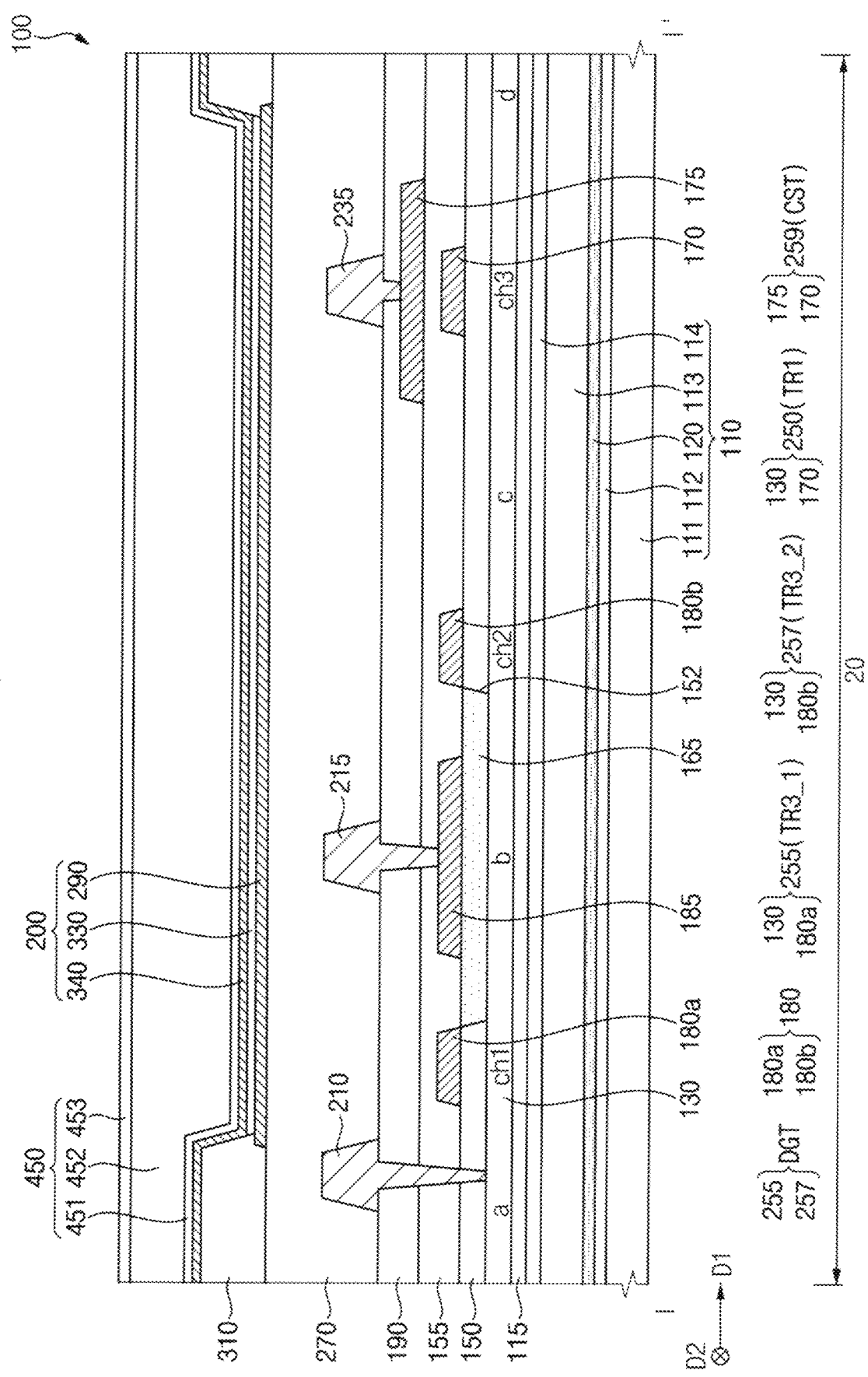
FIG. 9 is a cross-sectional view taken along line I-I' of FIG. 8.

FIG. 9 is a cross-sectional view taken along line I-I' of FIG. 8. In an embodiment, the first and third transistors TR1, TR3_1, and TR3_2, the storage capacitor CST, the capacitor CAP, or the like shown in FIGS. 3 to 8 are shown in the cross-sectional view, for example. For convenience of description, not all components included in the display device 100 may be shown in FIG. 9.

Referring to FIG. 9, the display device 100 may include a substrate 110, a buffer layer 115, a gate electrode pattern 185, a driving transistor 250, a dual gate transistor DGT, a storage capacitor 259, an insulating pattern 165, a first gate insulating layer 150, a second gate insulating layer 155, an inter-insulating layer 190, a connection pattern 215, a power supply wire 235, a connection electrode 210, a planarization layer 270, a light emitting structure 200, a pixel defining layer 310, a thin film encapsulation structure 450, or the like.

In this case, the substrate 110 may include a first organic layer 111, a first inorganic layer 112, a silicon layer 120, a second organic layer 113, and a second inorganic layer 114, and the active layer 130 may include a first region a, a second region b, a third region c, a fourth region d, a first channel region ch1, a second channel region ch2, and a third channel region ch3.

In addition, the first gate electrode 180 may include a first sub-gate electrode 180a and a second sub-gate electrode 180b, and the dual gate transistor DGT may include a first sub-transistor 255 and a second sub-transistor 257.

Further, the first sub-transistor 255 may include the active layer 130 (e.g., the first region a, the first channel region ch1, and the second region b) and the first sub-gate electrode 180a, and the second sub-transistor 257 may include the active layer 130 (e.g., the second region b, the second channel region ch2, and the third region c) and the second sub-gate electrode 180b.

In addition, the driving transistor 250 may include the active layer 130 (e.g., the third region c, the third channel region ch3, and the fourth region d) and the second gate electrode 170, and the storage capacitor 259 may include the second gate electrode 170 and the third gate electrode 175. In this case, the second gate electrode 170 may function as a gate electrode of the driving transistor 250, or a lower capacitor electrode of the storage capacitor 259.

Moreover, the light emitting structure 200 may include a lower electrode 290, a light emitting layer 330, and an upper electrode 340, and the thin film encapsulation structure 450 may include a first inorganic thin film encapsulation layer 451, an organic thin film encapsulation layer 452, and a second inorganic thin film encapsulation layer 453.

In an embodiment, the second region b of the active layer 130 and the gate electrode pattern 185 may correspond to the capacitor CAP shown in FIGS. 2 and 8.

The first organic layer 111 may be provided. The first organic layer 111 may include an organic material having flexibility. In an embodiment, the first organic layer 111 may include a random copolymer or a block copolymer, for example. In addition, the first organic layer 111 may have high transparency, a low coefficient of thermal expansion, and a high glass transition temperature. The first organic layer 111 may include an imide group, so that the first organic layer 111 may have an excellent heat resistance, an excellent chemical resistance, an excellent abrasion resistance, and excellent electrical properties. In an embodiment, the first organic layer 111 may include polyimide.

The first inorganic layer 112 may be disposed on the first organic layer 111. In other words, a top surface of the first organic layer 111 and a bottom surface of the first inorganic layer 112 may directly contact with each other, and the first inorganic layer 112 may be disposed over an entirety of the first organic layer 111. The first inorganic layer 112 may block moisture penetrating through the first organic layer 111. The first inorganic layer 112 may include an inorganic material having flexibility. In an embodiment, the first inorganic layer 112 may include a silicon compound, metal oxide, or the like.

The silicon layer 120 may be disposed on the first inorganic layer 112. The silicon layer 120 may bond the first inorganic layer 112 to the second organic layer 113. In other words, a bottom surface of the silicon layer 120 may directly contact with the first inorganic layer 112, a top surface of the silicon layer 120 may directly contact with the second organic layer 113, and the silicon layer 120 may be disposed over an entirety of the first inorganic layer 112 and the second organic layer 113 between the first inorganic layer 112 and the second organic layer 113. The silicon layer 120 may include a silicon material having an adhesive function. In an embodiment, the silicon layer 120 may include amorphous silicon (e.g., non-crystalline silicon).

The second organic layer 113 may be disposed on the silicon layer 120. In other words, the second organic layer 113 may be disposed over an entirety of the silicon layer 120. The second organic layer 113 may include an organic material having flexibility. In an embodiment, the second organic layer 113 may include a random copolymer or a block copolymer, for example. In an embodiment, the second organic layer 113 may include the same material as that of the first organic layer 111.

The second inorganic layer 114 may be disposed on the second organic layer 113. In other words, the second inorganic layer 114 may be disposed over an entirety of the second organic layer 113. The second inorganic layer 114 may block moisture penetrating through the second organic layer 113. The second inorganic layer 114 may include an inorganic material having flexibility. In an embodiment, the second inorganic layer 114 may include the same material as that of the first inorganic layer 112.

Accordingly, the substrate 110 including the first organic layer 111, the first inorganic layer 112, the silicon layer 120, the second organic layer 113, and the second inorganic layer 114 may be provided.

However, although the substrate 110 has been described as having five layers, the configuration of the invention is not limited thereto. In an embodiment, the substrate 110 may include at least four layers, for example.

According to other embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, or the like.

The buffer layer 115 may be disposed on the substrate 110. The buffer layer 115 may prevent metal atoms or impurities from diffusing from the substrate 110 to the driving transistor 250 and the dual gate transistor DGT, and may control a heat transfer rate during a crystallization process for forming the active layer 130 to obtain a substantially uniform active layer 130. In addition, when a surface of the substrate 110 is not uniform, the buffer layer 115 may serve to improve flatness of the surface of the substrate 110. Depending on a type of the substrate 110, at least two buffer layers 115 may be provided on the substrate 110, or the buffer layer 115 may not be provided. In an embodiment, the buffer layer 115 may include a silicon compound, metal oxide, or the like.

The active layer 130 may be disposed on the buffer layer 115. The active layer 130 may include a first region a, a second region b, a third region c, a fourth region d, a first channel region ch1, a second channel region ch2, and a third channel region ch3. In this case, the first channel region ch1 may be disposed between the first region a and the second region b, the second channel region ch2 may be disposed between the second region b and the third region c, and the third channel region ch3 may be disposed between the third region c and the fourth region d. The active layer 130 may include a metal oxide semiconductor, an inorganic semiconductor (e.g., amorphous silicon or polysilicon), an organic semiconductor, or the like.

The first gate insulating layer 150 may be disposed on the buffer layer 115 and the active layer 130. In an embodiment, an opening 152 that exposes the second region b may be defined in the first gate insulating layer 150. In an embodiment, the opening 152 may not overlap the first sub-gate electrode 180a and the second sub-gate electrode 180b, and may overlap the gate electrode pattern 185, for example.

The first gate insulating layer 150 may sufficiently cover the active layer 130 on the buffer layer 115, and may have a substantially flat top surface without creating a step around the active layer 130. In some embodiments, the first gate insulating layer 150 may be disposed along a profile of the active layer 130 with a uniform thickness to cover the active layer 130 on the buffer layer 115. In an embodiment, the first gate insulating layer 150 may include a silicon compound, metal oxide, or the like. In an embodiment, the first gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like, for example. In an embodiment, the first gate insulating layer 150 may include silicon oxide ($SiO_x$) having a relatively low dielectric constant. According to other embodiments, the first gate insulating layer 150 may have a multilayer structure including a plurality of insulating layers. The insulating layers may include mutually different materials from each other, and may have mutually different thicknesses from each other. In the description, the thicknesses may mean a length measured in a direction normal to a plane defined by the first and second directions D1 and D2.

The insulating pattern 165 may be disposed in the opening 152 on the active layer 130. The opening 152 may be completely filled with the insulating pattern 165, and a top surface of the insulating pattern 165 may not create a step with a top surface of the first gate insulating layer 150 disposed at a periphery of the opening 152. In other words, a thickness of the insulating pattern 165 and a thickness of the first gate insulating layer 150 may be substantially equal to each other. In an embodiment, a bottom surface of the insulating pattern 165 may contact the active layer 130, and the top surface of the insulating pattern 165 may contact a bottom surface of the gate electrode pattern 185.

In an embodiment, the insulating pattern 165 may include a silicon compound, metal oxide, or the like. In an embodiment, the insulating pattern 165 may include silicon nitride ($SiN_x$) having a relatively high dielectric constant. In other words, a dielectric constant of the insulating pattern 165 may be greater than a dielectric constant of the first gate insulating layer 150. In some embodiments, the insulating pattern 165 may include metal oxide having a high dielectric constant. In an embodiment, the insulating pattern 165 may include aluminum oxide ($AlO_x$), zirconium oxide ($ZrO_x$), hafnium oxide ($HfO_x$), titanium oxide ($TiO_x$), or the like, for example. In this case, the term "high dielectric constant" means that a dielectric constant K is greater or equal to 8.

However, although the opening 152 has been described as exposing an entire area of the active layer 130 disposed in the second region b, and as being filled with the insulating pattern 165, the configuration of the invention is not limited thereto. In an embodiment, the opening 152 may expose a portion of the active layer 130 disposed in the second region b, and the opening 152 may be filled with the insulating pattern 165, for example.

The first sub-gate electrode 180a may be disposed in the first channel region ch1 on the active layer 130, and the second sub-gate electrode 180b may be disposed in the second channel region ch2 on the active layer 130. In other words, the first gate electrode 180 may be disposed in the first channel region ch1 and the second channel region ch2 on the active layer 130. As shown in FIG. 8, the first sub-gate electrode 180a and the second sub-gate electrode 180b may be formed or provided unitarily with each other as one body, and the first sub-gate electrode 180a and the second sub-gate electrode 180b may function as gate electrodes of the dual gate transistor DGT. In an embodiment, the gate signal GW of FIG. 2 may be applied to the first gate electrode 180, for example. In other words, the first sub-gate electrode 180a may be defined as the first sub-transistor 255 (e.g., corresponding to the third transistor TR3_1 of FIG. 8) together with the first region a, the second region b, and the first channel region ch1 of the active layer 130, and the second sub-gate electrode 180b may be defined as the second sub-transistor 257 (e.g., corresponding to the third transistor TR3_2 of FIG. 8) together with the second region b, the third region c, and the second channel region ch2 of the active layer 130.

In an embodiment, the first gate electrode 180 may include a metal, an alloy, metal nitride, conductive metal oxide, a transparent conductive material, or the like. These may be used alone or in any combinations with each other. According to other embodiments, the first gate electrode 180 may have a multilayer structure including a plurality of metal layers. The metal layers may include mutually different materials from each other, and may have mutually different thicknesses from each other.

The second gate electrode 170 may be disposed in the third channel region ch3 on the active layer 130. The second gate electrode 170 may be spaced apart from the first gate electrode 180 and the gate electrode pattern 185. The second gate electrode 170 may be defined as the driving transistor 250 (e.g., the first transistor TR1 of FIG. 8) together with the third region c, the fourth region d, and the third channel region ch3 of the active layer 130. In an embodiment, the second gate electrode 170 may include a metal, an alloy, metal nitride, conductive metal oxide, a transparent conductive material, or the like. These may be used alone or in any combinations with each other. According to other embodiments, the second gate electrode 170 may have a multilayer structure including a plurality of metal layers. The metal layers may include mutually different materials from each other, and may have mutually different thicknesses from each other.

The gate electrode pattern 185 may be disposed in the second region b on the active layer 130. The gate electrode pattern 185 may be spaced apart from the first gate electrode 180. In an embodiment, the gate electrode pattern 185 may be disposed in the same layer as the first gate electrode 180 and the second gate electrode 170. In addition, the first power supply voltage ELVDD (refer to FIG. 2) may be applied to the gate electrode pattern 185. Further, the gate electrode pattern 185 and the second region b of the active layer 130 may be defined as the capacitor CAP (refer to FIG. 2), and the insulating pattern 165 having a relatively high dielectric constant may be interposed between the gate electrode pattern 185 and the second region b. In an embodiment, the gate electrode pattern 185, the first gate electrode 180 and the second gate electrode 170 may have the same height, but the invention is not limited thereto.

In an embodiment, the gate electrode pattern 185 may include a metal, an alloy, metal nitride, conductive metal oxide, a transparent conductive material, or the like. In an embodiment, the gate electrode pattern 185 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide (SrRu$_x$O$_y$), zinc oxide (ZnO$_x$), indium tin oxide ("ITO"), tin oxide (SnO$_x$), indium oxide (InO$_x$), gallium oxide (GaO$_x$), indium zinc oxide ("IZO"), or the like, for example. These may be used alone or in any combinations with each other. According to other embodiments, the gate electrode pattern 185 may have a multilayer structure including a plurality of metal layers. The metal layers may include mutually different materials from each other, and may have mutually different thicknesses from each other.

According to a conventional display device, in order for the conventional display device to be driven at a low frequency (e.g., about 30 hertz (Hz) or less), a leakage current of a third transistor has to be reduced, for example. In order to reduce the leakage current, the third transistor included in the conventional display device has been changed from a single transistor to a dual gate transistor. In addition, in order to further reduce the leakage current, a lightly doped drain ("LDD") has been added to the dual gate transistor. In this case, it may be difficult to apply the LDD to the dual gate transistor due to limitations such as an LDD area ensuring issue, a process dispersion issue, and an element characteristic ensuring issue. Alternatively, in order to further reduce the leakage current, a bottom metal layer ("BML") has been added to a common region of the dual gate transistor (e.g., the first node N1 of FIG. 2 or the second region b of FIG. 8). In this case, a capacitor may be formed or provided in the BML and the common region. However, since two mask processes (e.g., a BML patterning process and a contact hole process for exposing a portion of the BML) are added to form the BML, a manufacturing cost may be relatively increased. In addition, the BML may be disposed between a buffer layer and a second barrier layer, and a thickness of the buffer layer may be approximately 3500 angstroms. Since a distance between the BML and the common region is relatively great, a capacitance of the capacitor may be relatively small. When the capacitance of the capacitor is small, the leakage current may not be significantly reduced, so that the conventional display device may not be driven at a low frequency.

In the embodiments, since the gate electrode pattern 185, the first gate electrode 180, and the second gate electrode 170 are simultaneously formed or provided in the same process, a manufacturing cost may be relatively reduced. In addition, since a distance between the gate electrode pattern 185 and the second region b is relatively small, a capacitance of the capacitor CAP may be relatively increased. Moreover, since the insulating pattern 165 having a relatively high dielectric constant is interposed between the gate electrode pattern 185 and the second region b, the capacitance of the capacitor CAP may be further increased. Accordingly, the leakage current may be significantly reduced in the second region b.

The second gate insulating layer 155 may be disposed on the first gate insulating layer 150, the first gate electrode 180, the second gate electrode 170, and the gate electrode pattern 185. The second gate insulating layer 155 may sufficiently cover the first gate electrode 180, the second gate electrode 170, and the gate electrode pattern 185 on the first gate insulating layer 150, and may have a substantially flat top surface without creating a step around the first gate electrode 180, the second gate electrode 170, and the gate electrode pattern 185. In some embodiments, the second gate insulating layer 155 may be disposed along a profile of the first gate electrode 180, the second gate electrode 170, and the gate electrode pattern 185 with a uniform thickness to cover the first gate electrode 180, the second gate electrode 170, and the gate electrode pattern 185 on the first gate insulating layer 150. In an embodiment, the second gate insulating layer 155 may include a silicon compound, metal oxide, or the like. According to other embodiments, the second gate insulating layer 155 may have a multilayer structure including a plurality of insulating layers. The insulating layers may include mutually different materials from each other, and may have mutually different thicknesses from each other.

The third gate electrode 175 may be disposed on the second gate insulating layer 155. In other words, the third gate electrode 175 may be disposed on a portion of the second gate insulating layer 155 under which the second gate electrode 170 is disposed. The third gate electrode 175 may be defined as the storage capacitor 259 (e.g., the storage capacitor CST of FIG. 2) together with the second gate electrode 170. In an embodiment, the third gate electrode 175 may include a metal, an alloy, metal nitride, conductive metal oxide, a transparent conductive material, or the like. These may be used alone or in any combinations with each other. According to other embodiments, the third gate electrode 175 may have a multilayer structure including a plurality of metal layers. The metal layers may include mutually different materials from each other, and may have mutually different thicknesses from each other.

The inter-insulating layer 190 may be disposed on the second gate insulating layer 155 and the third gate electrode 175. The inter-insulating layer 190 may sufficiently cover the third gate electrode 175 on the second gate insulating layer 155, and may have a substantially flat top surface without creating a step around the third gate electrode 175. In some embodiments, the inter-insulating layer 190 may be disposed along a profile of the third gate electrode 175 with a uniform thickness to cover the third gate electrode 175 on the second gate insulating layer 155. In an embodiment, the inter-insulating layer 190 may include a silicon compound, metal oxide, or the like. According to other embodiments, the inter-insulating layer 190 may have a multilayer structure including a plurality of insulating layers. The insulating layers may include mutually different materials from each other, and may have mutually different thicknesses from each other.

The connection pattern 215 may be disposed in the second region b on the inter-insulating layer 190. The first power supply voltage ELVDD (refer to FIG. 2) may be applied to the connection pattern 215. The connection pattern 215 may be connected to the gate electrode pattern 185 through a contact hole defined by removing portions of the second gate insulating layer 155 and the inter-insulating layer 190. In other words, the first power supply voltage ELVDD may be provided to the gate electrode pattern 185 through the connection pattern 215. In an embodiment, the connection pattern 215, the power supply wire 235, and the connection electrode 210 may be disposed in the same layer. In an embodiment, the connection pattern 215 may include a metal, an alloy, metal nitride, conductive metal oxide, a transparent conductive material, or the like. These may be used alone or in any combinations with each other. According to other embodiments, the connection pattern 215 may have a multilayer structure including a plurality of metal layers. The metal layers may include mutually different materials from each other, and may have mutually different thicknesses from each other.

The power supply wire 235 may be disposed in the third channel region ch3 on the inter-insulating layer 190. The power supply wire 235 may be spaced apart from the connection pattern 215 and the connection electrode 210. The power supply wire 235 may function as a wire. In an embodiment, the first power supply voltage ELVDD (refer to FIG. 2) may be applied to the power supply wire 235, and the power supply wire 235 may extend in the second direction D2, for example. The power supply wire 235 may be connected to the third gate electrode 175 through a contact hole defined by removing a portion of the inter-insulating layer 190. In other words, the first power supply voltage ELVDD may be applied to the third gate electrode 175. In an embodiment, the power supply wire 235 may include a metal, an alloy, metal nitride, conductive metal oxide, a transparent conductive material, or the like. These may be used alone or in any combinations with each other. According to other embodiments, the power supply wire 235 may have a multilayer structure including a plurality of metal layers. The metal layers may include mutually different materials from each other, and may have mutually different thicknesses from each other.

The connection electrode 210 may be disposed in the first region a on the inter-insulating layer 190. The connection electrode 210 may be spaced apart from the connection pattern 215 and the power supply wire 235. In an embodiment, a first portion of the connection electrode 210 may be connected to the first region a, and a second portion of the connection electrode 210 may be connected to the second gate electrode 170 in another cross-sectional view of the display device 100, for example. In other words, the initialization voltage VINT (refer to FIG. 2) applied to the first region a may be provided to the second gate electrode 170 through the connection electrode 210. The first portion of the connection electrode 210 may be connected to the first region a of the active layer 130 through a contact hole defined by removing portions of the first gate insulating layer 150, the second gate insulating layer 155, and the inter-insulating layer 190. In an embodiment, the connection electrode 210 may include a metal, an alloy, metal nitride, conductive metal oxide, a transparent conductive material, or the like. These may be used alone or in any combinations with each other. According to other embodiments, the connection electrode 210 may have a multilayer structure including a plurality of metal layers. The metal layers may include mutually different materials from each other, and may have mutually different thicknesses from each other.

The planarization layer 270 may be disposed on the inter-insulating layer 190, the connection pattern 215, the power supply wire 235, and the connection electrode 210. The planarization layer 270 may have a relatively thick thickness to sufficiently cover the connection pattern 215, the power supply wire 235, and the connection electrode 210. The planarization layer 270 may include an organic insulating material or an inorganic insulating material. In an embodiment, the planarization layer 270 may include an organic insulating material. In an embodiment, the planarization layer 270 may include a photoresist, a polyacryl-based resin, a polyimide-based resin, a polyamide-based resin, a siloxane-based resin, an acryl-based resin, an epoxy-based resin, or the like, for example.

The lower electrode 290 may be disposed on the planarization layer 270. In an embodiment, the lower electrode 290 may include a metal, an alloy, metal nitride, conductive metal oxide, a transparent conductive material, or the like. These may be used alone or in any combinations with each other. According to other embodiments, the lower electrode 290 may have a multilayer structure including a plurality of metal layers. The metal layers may include mutually different materials from each other, and may have mutually different thicknesses from each other.

The pixel defining layer 310 may be disposed on the planarization layer 270 and a portion of the lower electrode 290. In other words, the pixel defining layer 310 may expose a portion of the lower electrode 290. The pixel defining layer 310 may include an organic insulating material or an inorganic insulating material. In an embodiment, the pixel defining layer 310 may include an organic insulating material.

The light emitting layer 330 may be disposed on the lower electrode 290. The light emitting layer 330 may have a multilayer structure including an organic light emission layer ("EML"), a hole injection layer ("HIL"), a hole transport layer ("HTL"), an electron transport layer ("ETL"), an electron injection layer ("EIL"), or the like. In an embodiment, the EML of the light emitting layer 330 may be formed or provided by at least one of light emitting materials for emitting different color lights (i.e., a red light, a green light, a blue light, etc.) according to sub-pixels. In an alternative embodiment, the EML of the light emitting layer 330 may be formed or provided by stacking a plurality of light emitting materials for generating different color lights such as a red light, a green light, and a blue light to emit a white light as a whole. In this case, a color filter may be disposed on the light emitting layer 330 disposed on the lower electrode 290. In an embodiment, the color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330. The second power supply voltage ELVSS (refer to FIG. 2) may be applied to the upper electrode 340. In an embodiment, the upper electrode 340 may include a metal, an alloy, metal nitride, conductive metal oxide, a transparent conductive material, or the like. These may be used alone or in any combinations with each other. According to other embodiments, the upper electrode 340 may have a multilayer structure including a plurality of metal layers. In an embodiment, the metal layers may include mutually different materials from each other, and may have mutually different thicknesses from each other, for example.

Accordingly, the light emitting structure 200 including the lower electrode 290, the light emitting layer 330, and the upper electrode 340 may be provided.

The first inorganic thin film encapsulation layer 451 may be disposed on the upper electrode 340. In an embodiment, the first inorganic thin film encapsulation layer 451 may be disposed along a profile of the upper electrode 340, for example. The first inorganic thin film encapsulation layer 451 may prevent the light emitting structure 200 from deteriorating due to penetration of moisture, oxygen, or the like. In addition, the first inorganic thin film encapsulation layer 451 may perform a function of protecting the light emitting structure 200 from an external impact. The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display device 100, and may protect the light emitting structure 200 together with the first inorganic thin film encapsulation layer 451. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the light emitting structure 200 from deteriorating due to the penetration of moisture, oxygen, or the like together with the first inorganic thin film encapsulation layer 451. In addition, the second inorganic thin film encapsulation layer 453 may perform a function of protecting the light emitting structure 200 from an external impact together with the first inorganic thin film encapsulation layer 451 and the organic thin film encapsulation layer 452. The second inorganic thin film encapsulation layer 453 may include an inorganic insulating material having flexibility.

Accordingly, the thin film encapsulation structure 450 including the first inorganic thin film encapsulation layer 451, the organic thin film encapsulation layer 452, and the second inorganic thin film encapsulation layer 453 may be provided. In some embodiments, the thin film encapsulation structure 450 may have a five-layer structure in which first to fifth thin film encapsulation layers are stacked or a seven-layer structure in which first to seventh thin film encapsulation layers are stacked.

Since the display device 100 in the embodiments of the invention includes the gate electrode pattern 185 disposed in the same layer as the first gate electrode 180 and the second gate electrode 170, the distance between the gate electrode pattern 185 and the second region b may be relatively reduced, and the capacitance of the capacitor CAP may be relatively increased. In addition, since the insulating pattern 165 having a relatively high dielectric constant is interposed between the gate electrode pattern 185 and the second region b, the capacitance of the capacitor CAP may be further increased. Accordingly, the leakage current may be significantly reduced in the second region b, and the display device 100 may be driven at a low frequency.

FIGS. 10 to 22 are views showing an embodiment of a method of manufacturing a display device according to the invention.

Figure 10:
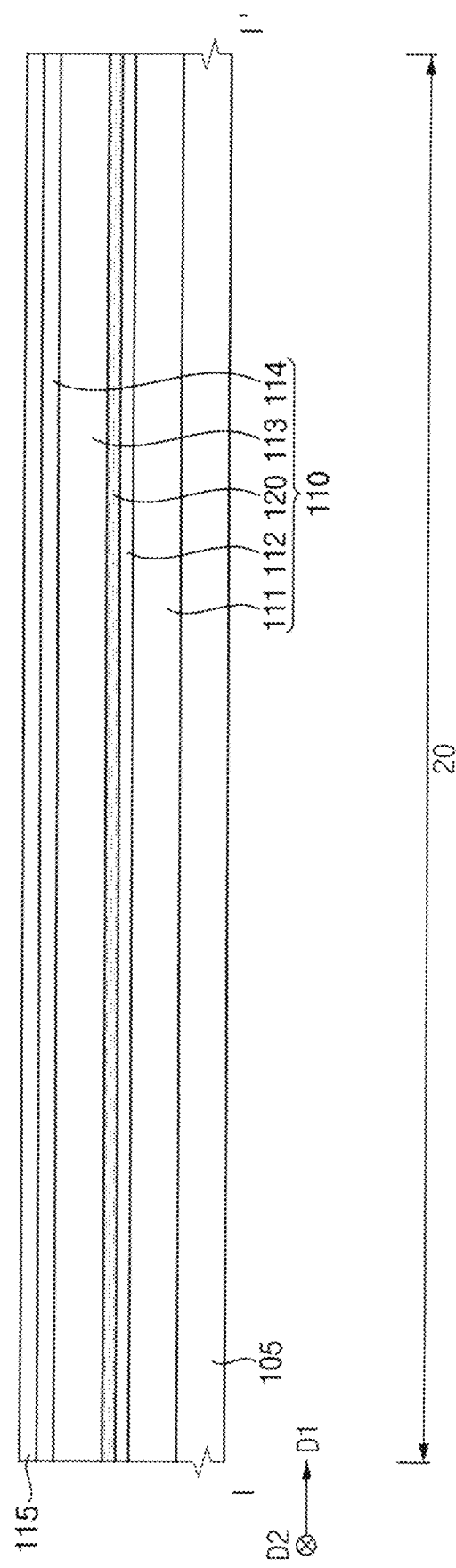
FIGS. 10 to 22 are views showing an embodiment of a method of manufacturing a display device according to the invention.

Referring to FIG. 10, a rigid glass substrate 105 may be provided. A first organic layer 111 may be formed or disposed on the glass substrate 105. The first organic layer 111 may be formed or provided by an organic material having flexibility. In an embodiment, the first organic layer 111 may include polyimide.

A first inorganic layer 112 may be formed or disposed on the first organic layer 111. The first inorganic layer 112 may block moisture penetrating through the first organic layer 111. The first inorganic layer 112 may be formed or provided by an inorganic material having flexibility. In an embodiment, the first inorganic layer 112 may include a silicon compound, metal oxide, or the like.

A silicon layer 120 may be formed or disposed on the first inorganic layer 112. The silicon layer 120 may include a silicon material having an adhesive function. In an embodiment, the silicon layer 120 may be formed or disposed by amorphous silicon.

A second organic layer 113 may be formed or disposed on the silicon layer 120. The second organic layer 113 may be formed or provided by an organic material having flexibility. In an embodiment, the second organic layer 113 may include polyimide, for example.

A second inorganic layer 114 may be formed or disposed on the second organic layer 113. The second inorganic layer 114 may block moisture penetrating through the second organic layer 113. The second inorganic layer 114 may be formed or provided by an inorganic material having flex-ibility. In an embodiment, the second inorganic layer 114 may include the same material as that of the first inorganic layer 112.

Accordingly, a substrate 110 including the first organic layer 111, the first inorganic layer 112, the silicon layer 120, the second organic layer 113, and the second inorganic layer 114 may be formed or provided.

Since the substrate 110 is thin and flexible, the substrate 110 may be formed or disposed on the rigid glass substrate 105. In an embodiment, after performing a subsequent process, the glass substrate may be removed from the substrate 110, for example. In other words, due to the flexible physical properties of the substrate 110, it may be difficult to directly perform the subsequent process on the substrate 110. When taking the above point into consideration, the subsequent process may be performed by the rigid glass substrate 105, and the glass substrate 105 may be removed, so that the first organic layer 111, the first inorganic layer 112, the second organic layer 113, and the second inorganic layer 114 may be used as the substrate 110. In addition, the silicon layer 120 may be interposed between the first inorganic layer 112 and the second organic layer 113 so that the first organic layer 111, the first inorganic layer 112, the second organic layer 113, and the second inorganic layer 114 may not be separated from each other when the glass substrate 105 is peeled off from the substrate 110.

A buffer layer 115 may be formed or disposed on the substrate 110. Depending on a type of the substrate 110, at least two buffer layers 115 may be provided on the substrate 110, or the buffer layer 115 may not be provided. In an embodiment, the buffer layer 115 may be formed or provided by a silicon compound, metal oxide, or the like.

Figure 11:
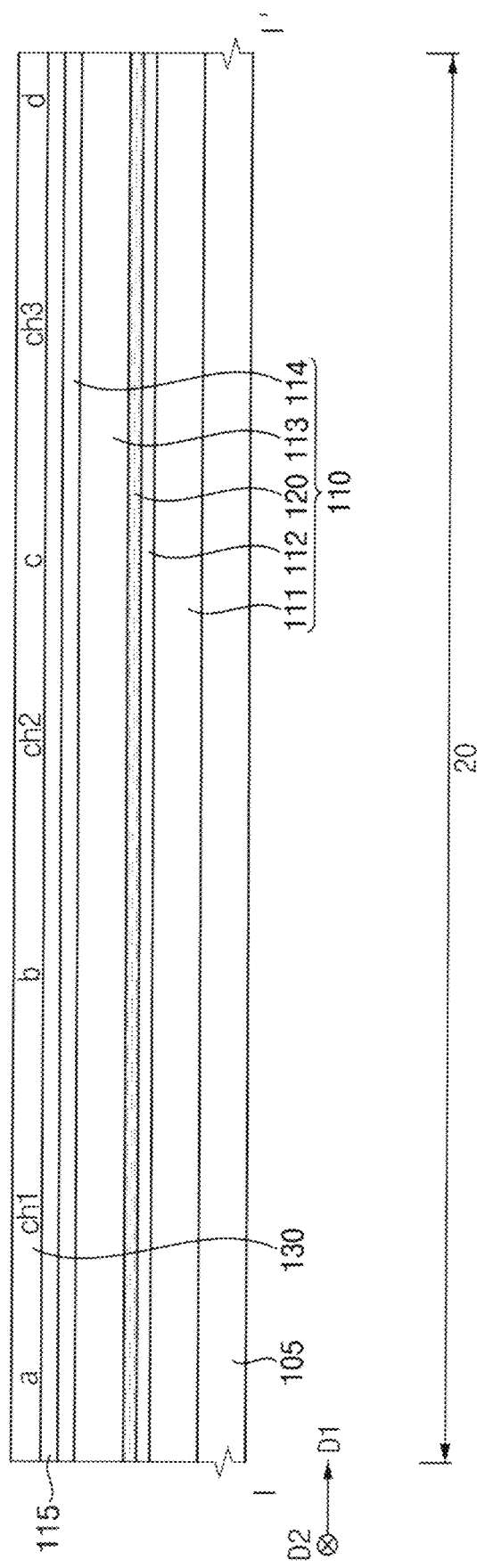

Referring to FIG. 11, an active layer 130 may be formed or disposed on the buffer layer 115. The active layer 130 may include a first region a, a second region b, a third region c, a fourth region d, a first channel region ch1, a second channel region ch2, and a third channel region ch3. In this case, the first channel region ch1 may be disposed between the first region a and the second region b, the second channel region ch2 may be disposed between the second region b and the third region c, and the third channel region ch3 may be disposed between the third region c and the fourth region d. In an embodiment, the active layer 130 may be formed or provided by a metal oxide semiconductor, an inorganic semiconductor, an organic semiconductor, or the like.

Figure 12:
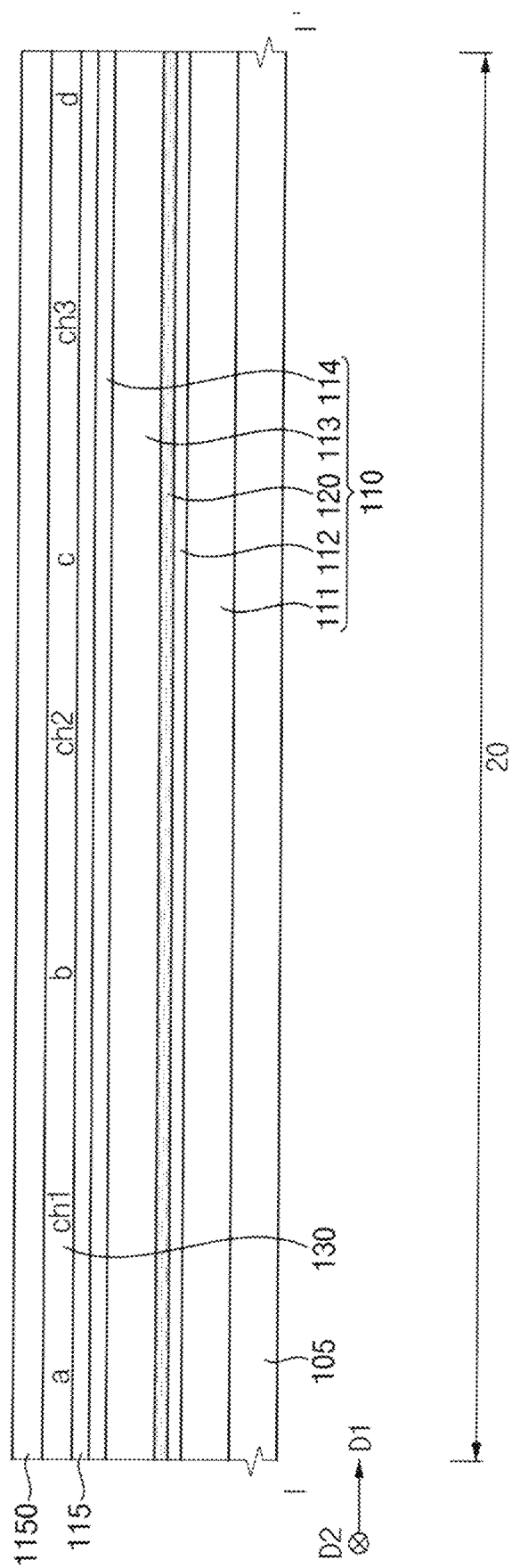

Referring to FIG. 12, a preliminary first gate insulating layer 1150 may be formed or disposed on the buffer layer 115 and the active layer 130. The preliminary first gate insulating layer 1150 may sufficiently cover the active layer 130 on the buffer layer 115, and may have a substantially flat top surface without creating a step around the active layer 130. In some embodiments, the preliminary first gate insulating layer 1150 may be formed or provided along a profile of the active layer 130 with a uniform thickness to cover the active layer 130 on the buffer layer 115. In an embodiment, the preliminary first gate insulating layer 1150 may be formed or provided by a silicon compound, metal oxide, or the like. In an embodiment, the preliminary first gate insulating layer 1150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, or the like, for example. In an embodiment, the preliminary first gate insulating layer 1150 may include $SiO_x$ having a relatively low dielectric constant. According to other embodiments, the preliminary first gate insulating layer 1150 may have a multilayer structure including a plurality of insulating layers. The insulating layers may include mutually different materials from each other, and may have mutually different thicknesses from each other.

Figure 13:
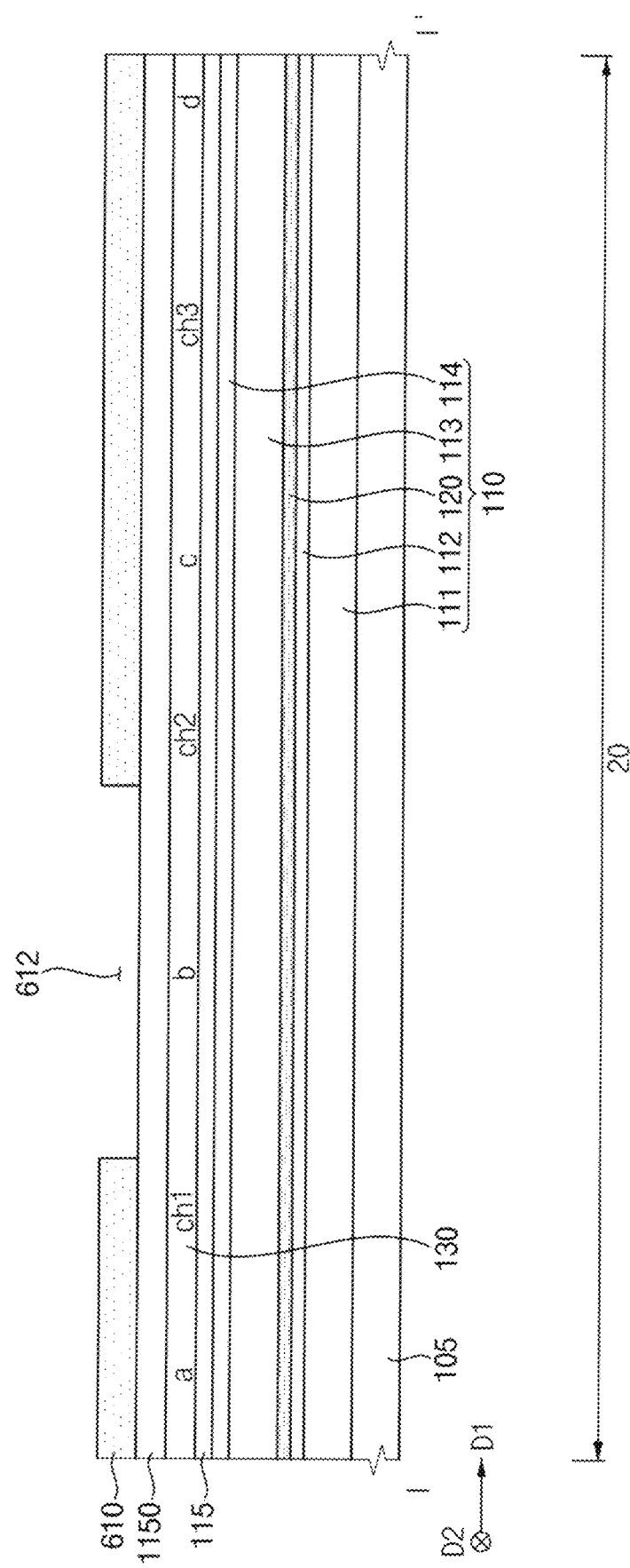

Referring to FIG. 13, a photoresist 610 defining an opening 612 that exposes the second region b may be formed or disposed on the preliminary first gate insulating layer 1150.

Figure 14:
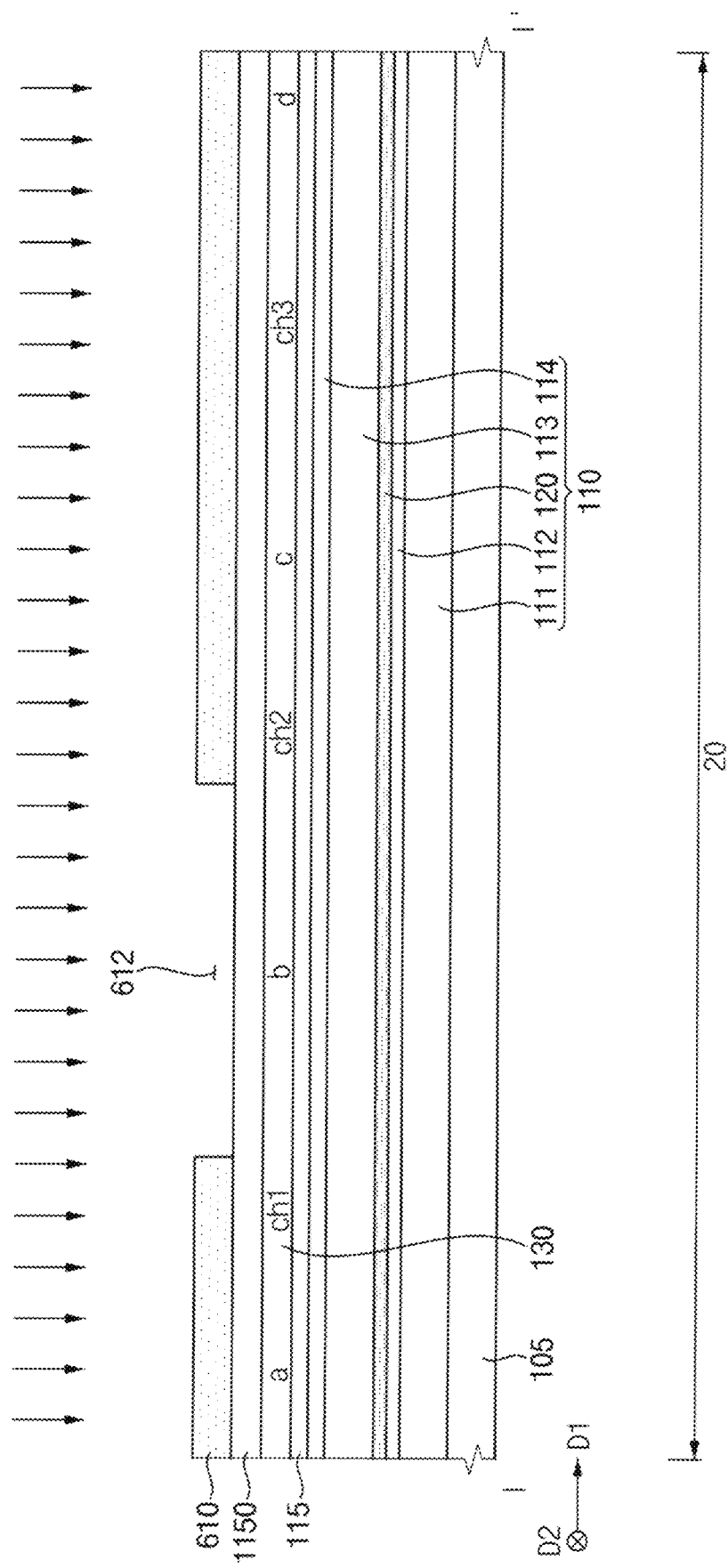

Referring to FIG. 14, after the photoresist 610 is formed or provided, an etching process may be performed over an entire area of the substrate 110. In an embodiment, the etching process may be a dry etching process, for example.

Figure 15:
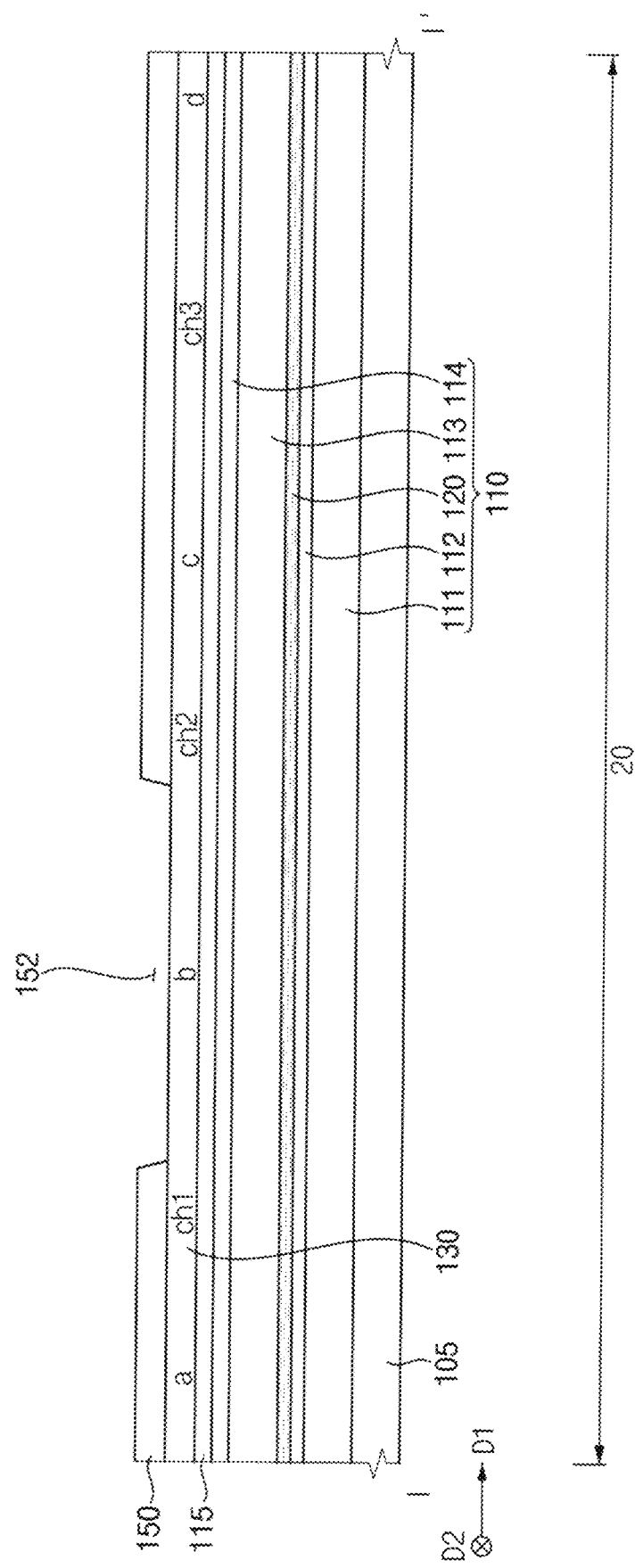

Referring to FIG. 15, an opening 152 may be defined in the preliminary first gate insulating layer 1150 overlapping the second region b through the etching process. Accordingly, a first gate insulating layer 150 defining the opening 152 may be formed or provided.

Figure 16:
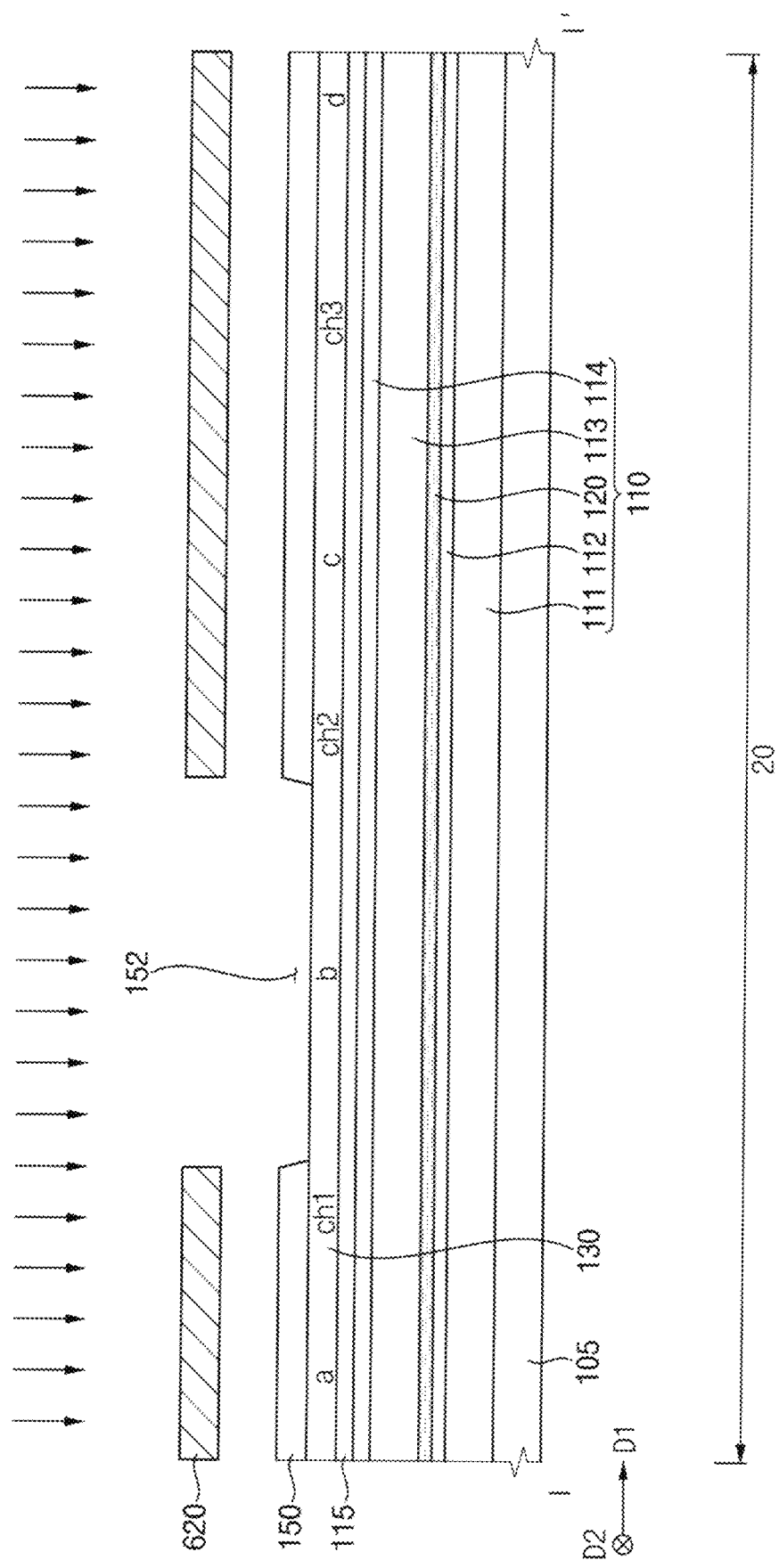

Referring to FIG. 16, after the first gate insulating layer 150 is formed or provided, a mask 620 defining an opening that overlaps the second region b may be arranged on the first gate insulating layer 150. After the mask 620 is arranged, a deposition process may be performed over the entire area of the substrate 110. In this case, a deposition material may include $SiN_x$.

Figure 17:
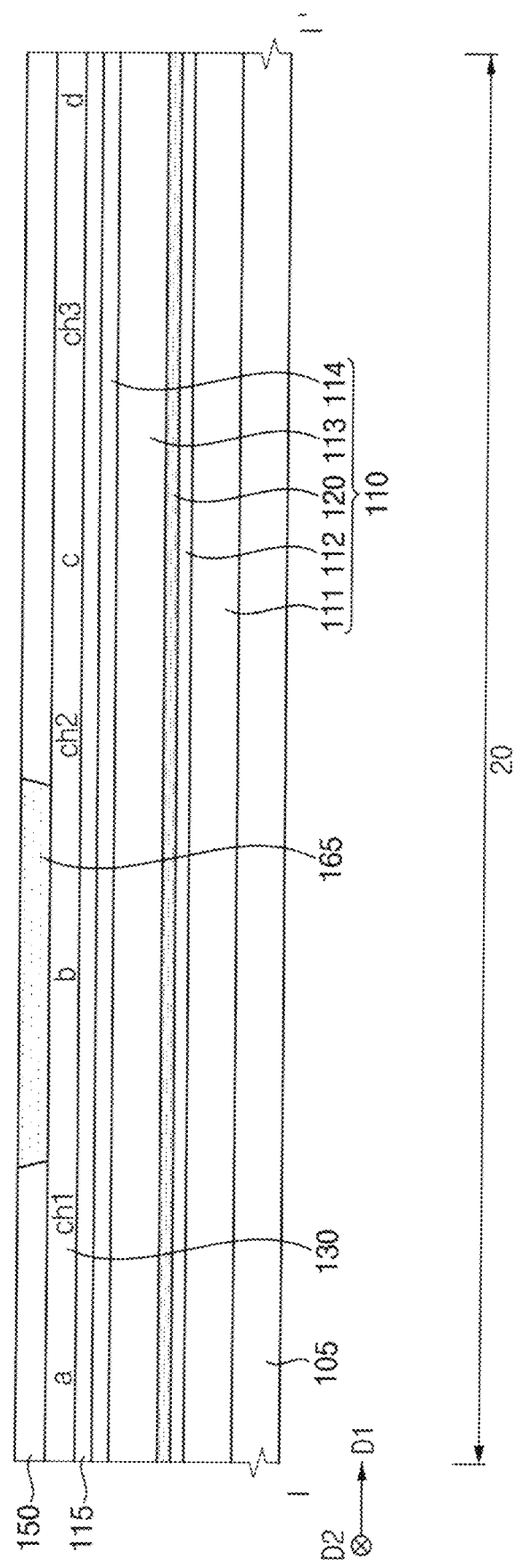

Referring to FIG. 17, an insulating pattern 165 may be formed or provided in the opening 152 through the deposition process. The opening 152 may be completely filled with the insulating pattern 165, and a top surface of the insulating pattern 165 may not create a step with a top surface of the first gate insulating layer 150 disposed at a periphery of the opening 152. In other words, a thickness of the insulating pattern 165 and a thickness of the first gate insulating layer 150 may be substantially equal to each other. In an embodiment, a dielectric constant of the insulating pattern 165 including $SiN_x$ may be greater than a dielectric constant of the first gate insulating layer 150 including $SiO_x$. In some embodiments, the insulating pattern 165 may be formed or provided by metal oxide having a high dielectric constant. In an embodiment, the insulating pattern 165 may include $AlO_x$, $ZrO_x$, $HfO_x$, $TiO_x$, or the like, for example. In this case, the term "high dielectric constant" means that a dielectric constant K is greater or equal to 8.

Figure 18:
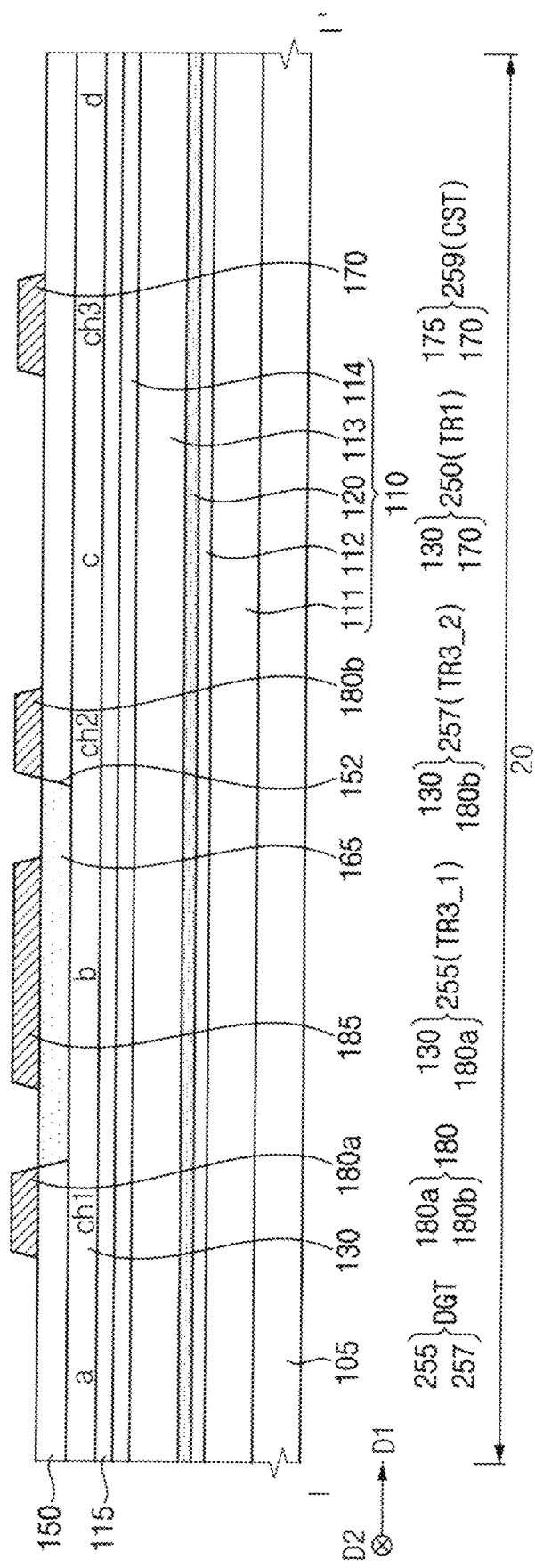

Referring to FIG. 18, a first gate electrode 180 including a first sub-gate electrode 180a and a second sub-gate electrode 180b and a second gate electrode 170 may be formed or disposed on the first gate insulating layer 150, and a gate electrode pattern 185 may be formed or disposed on the insulating pattern 165. In other words, the first sub-gate electrode 180a may overlap the first channel region ch1, the second sub-gate electrode 180b may overlap the second channel region ch2, the second gate electrode 170 may overlap the third channel region ch3, and the gate electrode pattern 185 may overlap the second region b.

In an embodiment, the first gate electrode 180, the gate electrode pattern 185, and the second gate electrode 170 may be formed or disposed in the same layer while being spaced apart from each other by the same material. In an embodiment, after a first preliminary electrode layer is formed or disposed over an entire area of the first gate insulating layer 150 and the insulating pattern 165, the first preliminary electrode layer may be selectively etched, so that the first gate electrode 180, the second gate electrode 170, and the gate electrode pattern 185 may be simultaneously formed or provided in the same process, for example.

In an embodiment, each of the first gate electrode 180, the second gate electrode 170, and the gate electrode pattern 185 may be formed or provided by a metal, an alloy, metal nitride, conductive metal oxide, a transparent conductive material, or the like. In an embodiment, each of the first gate electrode 180, the second gate electrode 170, and the gate electrode pattern 185 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, or the like, for example. These may be used alone or in any combinations with each other. According to other embodiments, each of the first gate electrode 180, the second gate electrode 170, and the gate electrode pattern 185 may have a multilayer structure including a plurality of metal layers. The metal layers may include mutually different materials from each other, and may have mutually different thicknesses from each other.

Figure 19:
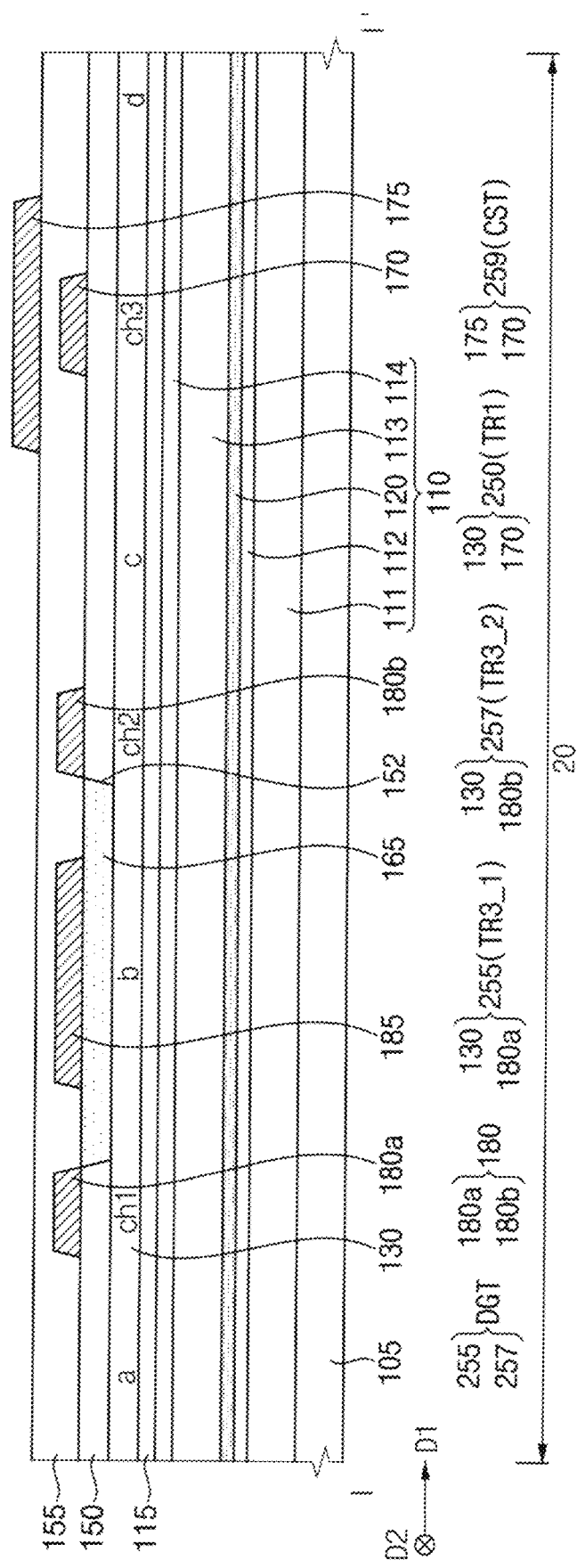

Referring to FIG. 19, a second gate insulating layer 155 may be formed or disposed on the first gate insulating layer 150, the first gate electrode 180, the second gate electrode 170, and the gate electrode pattern 185. The second gate insulating layer 155 may sufficiently cover the first gate electrode 180, the second gate electrode 170, and the gate electrode pattern 185 on the first gate insulating layer 150, and may have a substantially flat top surface without creating a step around the first gate electrode 180, the second gate electrode 170, and the gate electrode pattern 185. In some embodiments, the second gate insulating layer 155 may be disposed along a profile of the first gate electrode 180, the second gate electrode 170, and the gate electrode pattern 185 with a uniform thickness to cover the first gate electrode 180, the second gate electrode 170, and the gate electrode pattern 185 on the first gate insulating layer 150. In an embodiment, the second gate insulating layer 155 may be formed or provided by a silicon compound, metal oxide, or the like. According to other embodiments, the second gate insulating layer 155 may have a multilayer structure including a plurality of insulating layers. The insulating layers may include mutually different materials from each other, and may have mutually different thicknesses from each other.

A third gate electrode 175 may be formed or disposed on the second gate insulating layer 155. In other words, the third gate electrode 175 may be formed or disposed on a portion of the second gate insulating layer 155 under which the second gate electrode 170 is disposed. In an embodiment, the third gate electrode 175 may be formed or provided by a metal, an alloy, metal nitride, conductive metal oxide, a transparent conductive material, or the like. These may be used alone or in any combinations with each other. According to other embodiments, the third gate electrode 175 may have a multilayer structure including a plurality of metal layers. The metal layers may include mutually different materials from each other, and may have mutually different thicknesses from each other.

Figure 20:
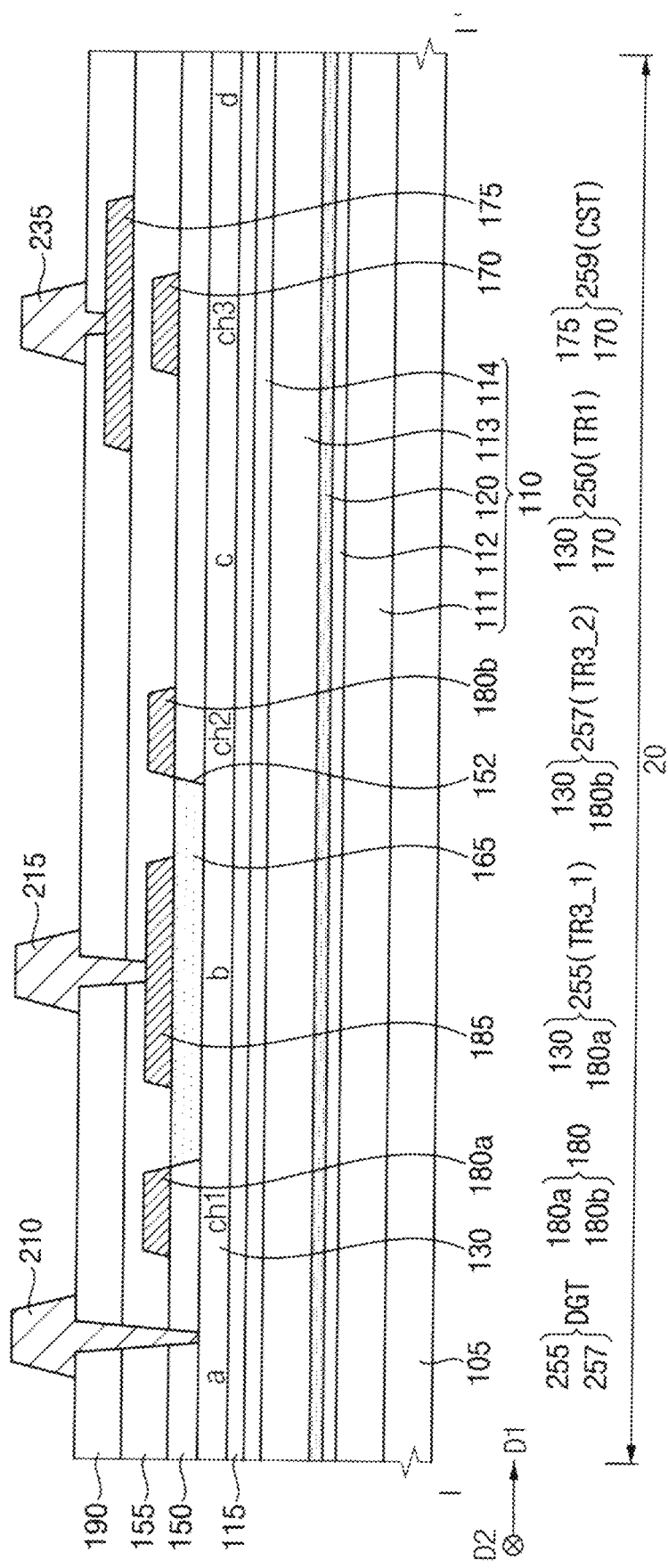

Referring to FIG. 20, an inter-insulating layer 190 may be formed or disposed on the second gate insulating layer 155 and the third gate electrode 175. The inter-insulating layer 190 may sufficiently cover the third gate electrode 175 on the second gate insulating layer 155, and may have a substantially flat top surface without creating a step around the third gate electrode 175. In some embodiments, the inter-insulating layer 190 may be disposed along a profile of the third gate electrode 175 with a uniform thickness to cover the third gate electrode 175 on the second gate insulating layer 155. In an embodiment, the inter-insulating layer 190 may be formed or provided by a silicon compound, metal oxide, or the like. According to other embodiments, the inter-insulating layer 190 may have a multilayer structure including a plurality of insulating layers. The insulating layers may include mutually different materials from each other, and may have mutually different thicknesses from each other.

A connection electrode 210, a connection pattern 215, and a power supply wire 235 may be formed or disposed on the inter-insulating layer 190 while being spaced apart from each other. In other words, the connection electrode 210 may overlap the first region a, the connection pattern 215 may overlap the second region b, and the power supply wire 235 may overlap the third region c. In an embodiment, the connection electrode 210, the connection pattern 215, and the power supply wire 235 may be simultaneously formed or provided in the same layer by the same material. In an embodiment, after a first contact hole defined by removing portions of the first gate insulating layer 150, the second gate insulating layer 155, and the inter-insulating layer 190, a second contact hole defined by removing portions of the second gate insulating layer 155 and the inter-insulating layer 190, and a third contact hole defined by removing a portion of the inter-insulating layer 190 are formed or provided, a second preliminary electrode layer may be formed or disposed over an entirety of the inter-insulating layer 190, and the second preliminary electrode layer may be selectively etched, so that the connection electrode 210, the connection pattern 215, and the power supply wire 235 may be simultaneously formed or provided in the same process, for example. In other words, the connection electrode 210 may be connected to the first region a of the active layer 130 through the first contact hole, the connection pattern 215 may be connected to the gate electrode pattern 185 through the second contact hole, and the power supply wire 235 may be connected to the third gate electrode 175 through the third contact hole.

In an embodiment, each of the connection electrode 210, the connection pattern 215, and the power supply wire 235 may be formed or provided by a metal, an alloy, metal nitride, conductive metal oxide, a transparent conductive material, or the like. These may be used alone or in any combinations with each other. According to other embodiments, each of the connection electrode 210, the connection pattern 215, and the power supply wire 235 may have a multilayer structure including a plurality of metal layers. The metal layers may include mutually different materials from each other, and may have mutually different thicknesses from each other.

Figure 21:
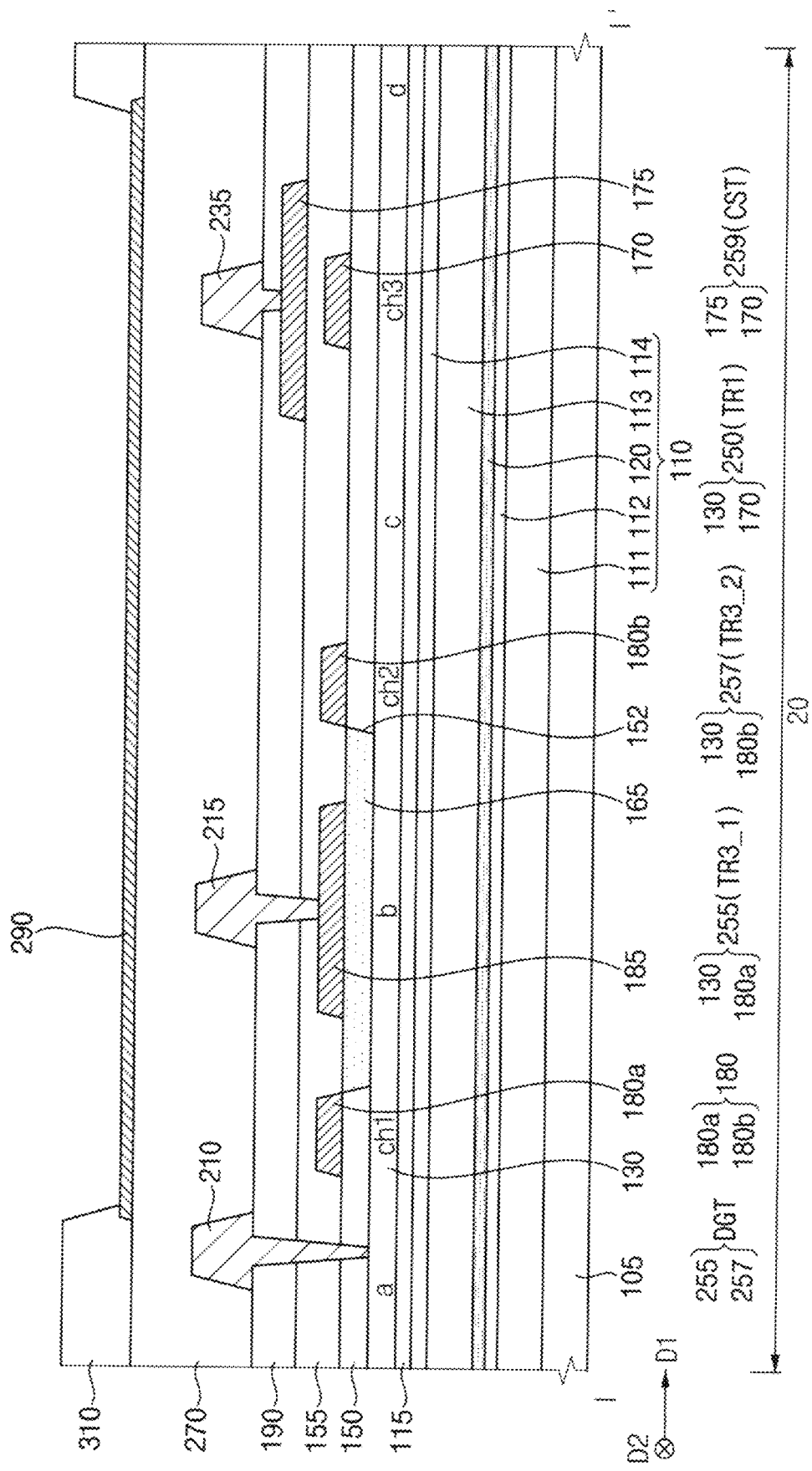

Referring to FIG. 21, a planarization layer 270 may be formed or disposed on the inter-insulating layer 190, the connection pattern 215, the power supply wire 235, and the connection electrode 210. The planarization layer 270 may have a relatively thick thickness to sufficiently cover the connection pattern 215, the power supply wire 235, and the connection electrode 210. In this case, the planarization layer 270 may have a substantially flat top surface. In order to implement such a flat top surface of the planarization layer 270, a planarization process may be additionally performed on the planarization layer 270. The planarization layer 270 may be formed or provided by an organic insulating material. In an embodiment, the planarization layer 270 may include a photoresist, a polyacryl-based resin, a polyimide-based resin, a polyamide-based resin, a siloxane-based resin, an acryl-based resin, an epoxy-based resin, or the like, for example.

A lower electrode 290 may be formed or disposed on the planarization layer 270. In an embodiment, the lower electrode 290 may be formed or provided by a metal, an alloy, metal nitride, conductive metal oxide, a transparent conductive material, or the like. These may be used alone or in any combinations with each other. According to other embodiments, the lower electrode 290 may have a multilayer structure including a plurality of metal layers. The metal layers may include mutually different materials from each other, and may have mutually different thicknesses from each other.

A pixel defining layer 310 may be formed or disposed on the planarization layer 270 and a portion of the lower electrode 290. In other words, the pixel defining layer 310 may expose a portion of the lower electrode 290. The pixel defining layer 310 may be formed or provided by an organic insulating material.

Figure 22:
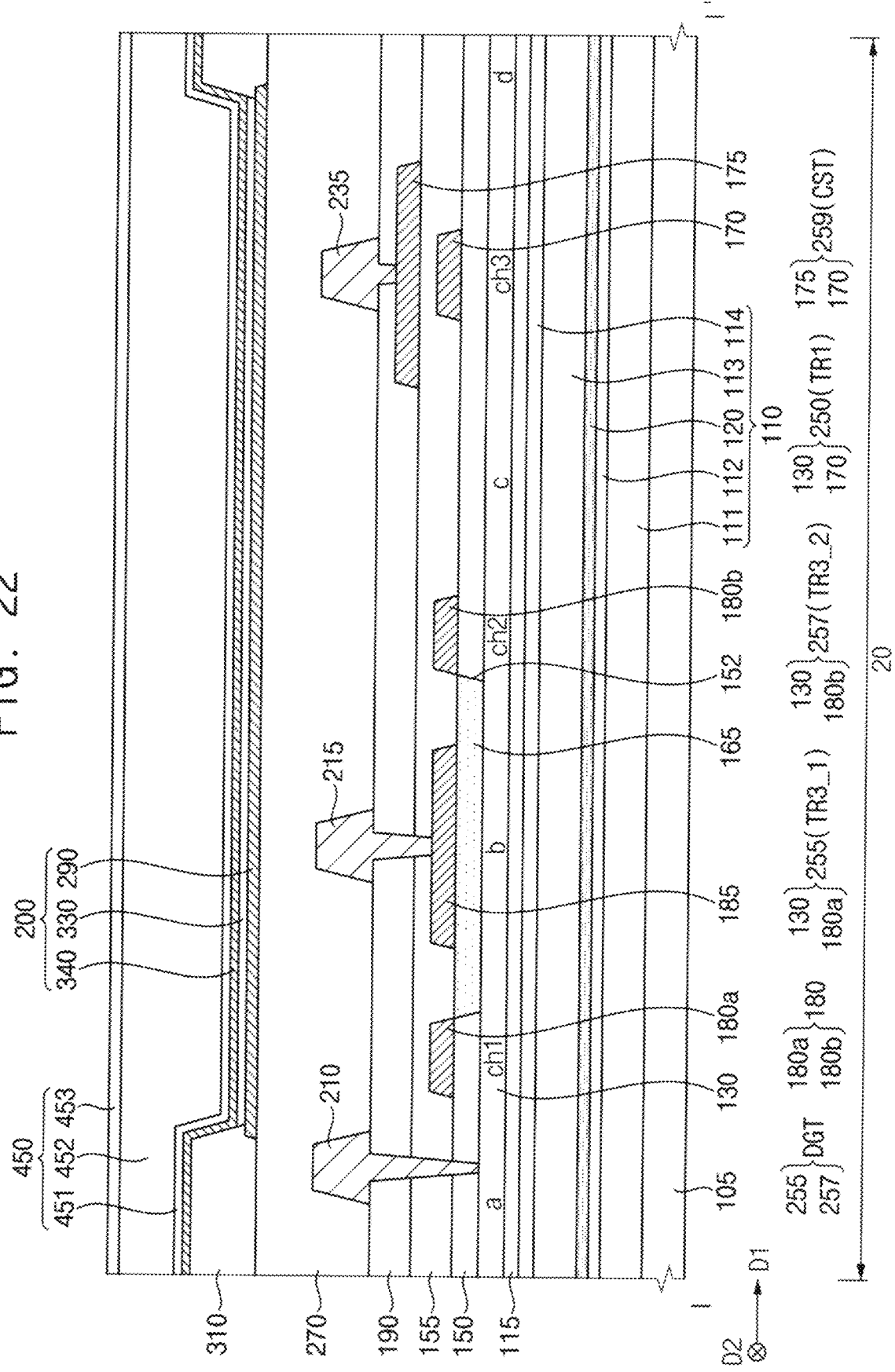

Referring to FIG. 22, a light emitting layer 330 may be formed or disposed on the lower electrode 290. The light emitting layer 330 may have a multilayer structure including an EML, a HIL, a HTL, an ETL, an EIL, or the like. The EML of the light emitting layer 330 may be formed or provided by at least one of light emitting materials for emitting different color lights (i.e., a red light, a green light, a blue light, etc.) according to sub-pixels. In an alternative embodiment, the EML of the light emitting layer 330 may be formed or provided by stacking a plurality of light emitting materials for generating different color lights such as a red light, a green light, and a blue light to emit a white light as a whole.

An upper electrode 340 may be formed or disposed on the light emitting layer 330. In an embodiment, the upper electrode 340 may be formed or provided by a metal, an alloy, metal nitride, conductive metal oxide, a transparent conductive material, or the like. These may be used alone or in any combinations with each other. According to other embodiments, the upper electrode 340 may have a multilayer structure including a plurality of metal layers. In an embodiment, the metal layers may include mutually different materials from each other, and may have mutually different thicknesses from each other, for example.

Accordingly, a light emitting structure 200 including the lower electrode 290, the light emitting layer 330, and the upper electrode 340 may be formed or provided.

A first inorganic thin film encapsulation layer 451 may be formed or disposed on the upper electrode 340. In an embodiment, the first inorganic thin film encapsulation layer 451 may be formed or provided along a profile of the upper electrode 340, for example. The first inorganic thin film encapsulation layer 451 may be formed or provided by an inorganic insulating material having flexibility.

An organic thin film encapsulation layer 452 may be formed or disposed on the first inorganic thin film encapsulation layer 451. The organic thin film encapsulation layer 452 may be formed or provided by an organic insulating material having flexibility.

A second inorganic thin film encapsulation layer 453 may be formed or disposed on the organic thin film encapsulation layer 452. The second inorganic thin film encapsulation layer 453 may be formed or provided along a profile of the organic thin film encapsulation layer 452 with a uniform thickness to cover the organic thin film encapsulation layer 452. The second inorganic thin film encapsulation layer 453 may be formed or provided by an inorganic insulating material having flexibility.

Accordingly, a thin film encapsulation structure 450 including the first inorganic thin film encapsulation layer 451, the organic thin film encapsulation layer 452, and the second inorganic thin film encapsulation layer 453 may be formed or provided.

Referring to FIG. 9, after the thin film encapsulation structure 450 is formed or provided, the glass substrate 105 may be removed from the substrate 110.

Accordingly, the display device 100 shown in FIGS. 1 to 9 may be manufactured.

According to the method of manufacturing the display device of the embodiments of the invention, since the gate electrode pattern 185, the first gate electrode 180, and the second gate electrode 170 are simultaneously formed or provided in the same process, a manufacturing cost of the display device may be relatively reduced.

Figure 23:
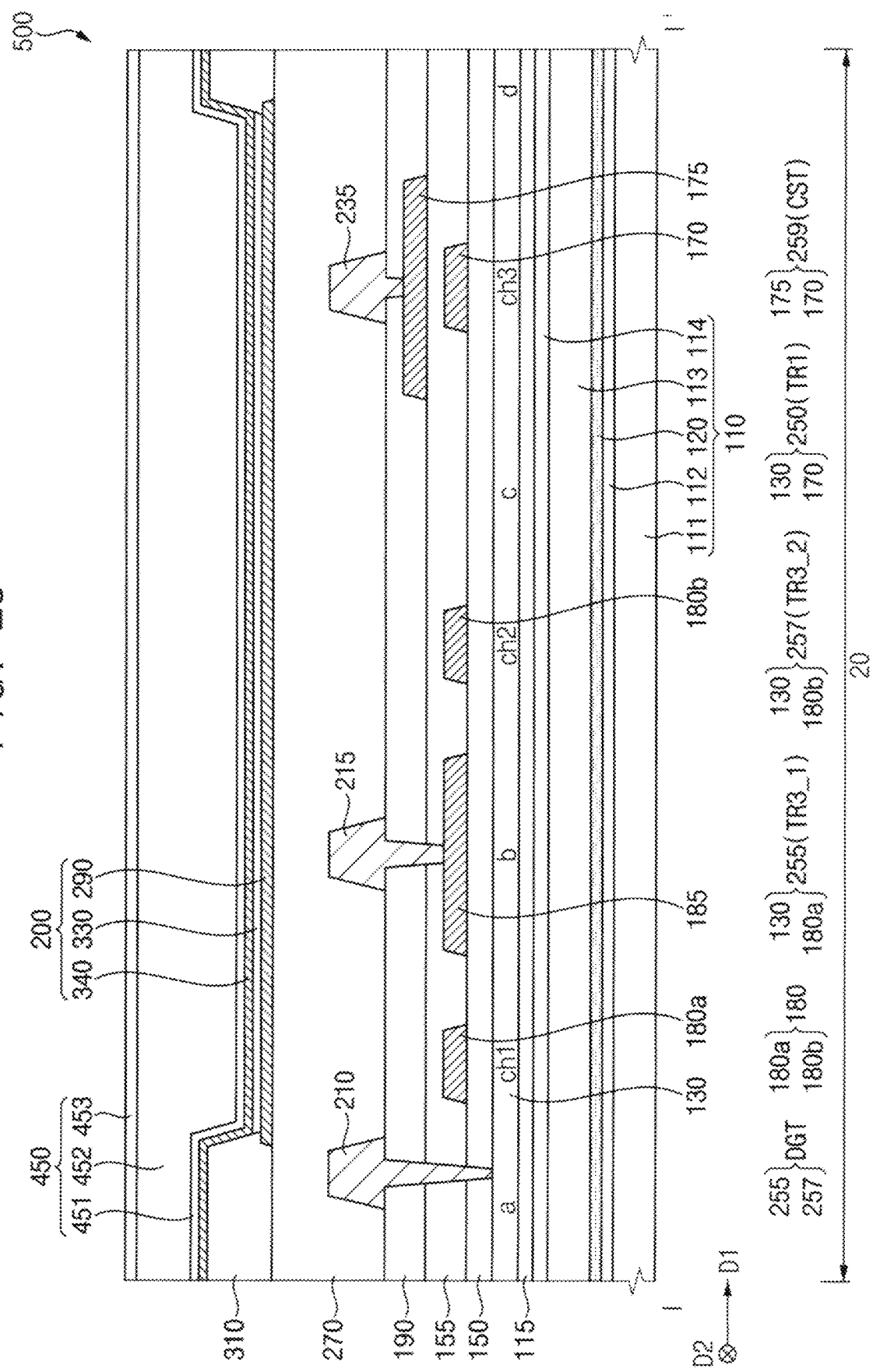
FIG. 23 is a cross-sectional view showing an embodiment of a display device according to the invention.

FIG. 23 is a cross-sectional view showing an embodiment of a display device according to the invention. A display device 500 illustrated in FIG. 23 may have a configuration that is substantially identical or similar to the configuration of the display device 100 described with reference to FIGS. 1 to 9 except for a shape of the first gate insulating layer 150. In FIG. 23, redundant descriptions of components that are substantially identical or similar to the components described with reference to FIGS. 1 to 9 will be omitted.

Referring to FIG. 23, the display device 500 may include a substrate 110, a buffer layer 115, a gate electrode pattern 185, a driving transistor 250, a dual gate transistor DGT, a storage capacitor 259, a first gate insulating layer 150, a second gate insulating layer 155, an inter-insulating layer 190, a connection pattern 215, a power supply wire 235, a connection electrode 210, a planarization layer 270, a light emitting structure 200, a pixel defining layer 310, a thin film encapsulation structure 450, or the like.

The first gate insulating layer 150 may be disposed on the buffer layer 115 and an active layer 130. In an embodiment, the first gate insulating layer 150 may be disposed over an entirety of the active layer 130 to cover the active layer 130.

According to a conventional display device, in order to further reduce a leakage current, a BML has been added to a common region of a dual gate transistor (e.g., the first node N1 of FIG. 2 or the second region b of FIG. 8), for example. In this case, a capacitor may be formed or provided in the BML and the common region. In this case, the BML may be disposed between a buffer layer and a second barrier layer, and a thickness of the buffer layer may be approximately 3500 angstroms. Since a distance between the BML and the common region is relatively great, a capacitance of the capacitor may be relatively small. When the capacitance of the capacitor is small, the leakage current may not be significantly reduced, so that the conventional display device may not be driven at a low frequency.

In the embodiments, when a thickness of the first gate insulating layer 150 is smaller than a thickness of the buffer layer 115, a capacitance of a capacitor CAP may be relatively increased. Accordingly, a leakage current may be reduced in the second region b, and the display device 500 may be driven at a low frequency. According to other embodiments, the first gate insulating layer 150 may include metal oxide having a high dielectric constant. In this case, the capacitance of the capacitor CAP may be further increased.

Figure 24:
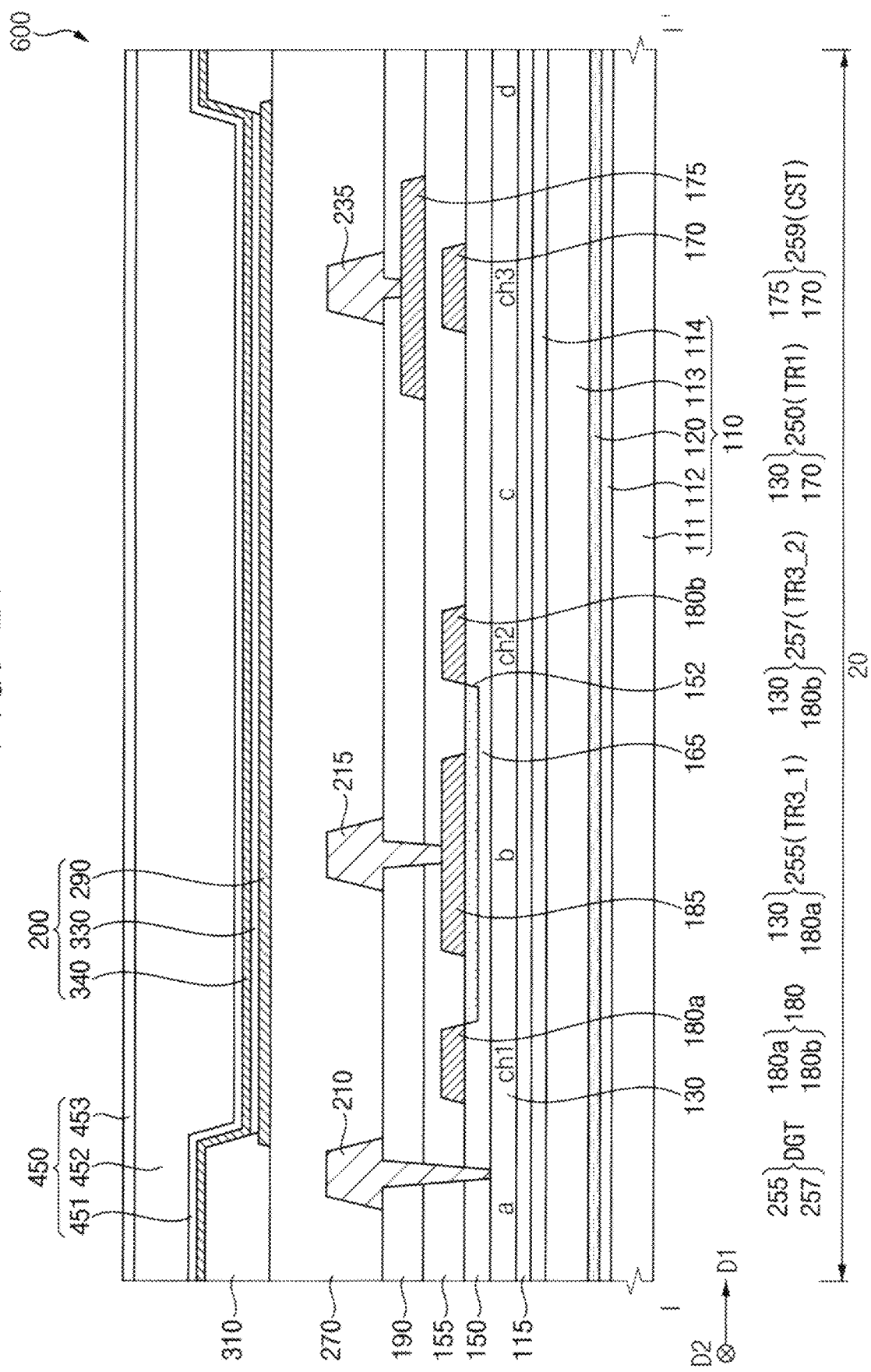
FIG. 24 is a cross-sectional view showing an embodiment of a display device according to the invention.

FIG. 24 is a cross-sectional view showing an embodiment of a display device according to the invention. A display device 600 illustrated in FIG. 24 may have a configuration that is substantially identical or similar to the configuration of the display device 100 described with reference to FIGS. 1 to 9 except for a shape of the insulating pattern 165. In FIG. 24, redundant descriptions of components that are substantially identical or similar to the components described with reference to FIGS. 1 to 9 will be omitted.

Referring to FIG. 24, the display device 600 may include a substrate 110, a buffer layer 115, a gate electrode pattern 185, a driving transistor 250, a dual gate transistor DGT, a storage capacitor 259, a first gate insulating layer 150, an insulating pattern 165, a second gate insulating layer 155, an inter-insulating layer 190, a connection pattern 215, a power supply wire 235, a connection electrode 210, a planarization layer 270, a light emitting structure 200, a pixel defining layer 310, a thin film encapsulation structure 450, or the like.

The first gate insulating layer 150 may be disposed on the buffer layer 115 and an active layer 130. In an embodiment, a groove 152 that overlaps a second region b may be defined in the first gate insulating layer 150. In an embodiment, the groove 152 may not overlap a first sub-gate electrode 180a and a second sub-gate electrode 180b, and may overlap the gate electrode pattern 185, for example.

The insulating pattern 165 may be disposed in the groove 152 on the active layer 130. The groove 152 may be completely filled with the insulating pattern 165, and a top surface of the insulating pattern 165 may not form a step with a top surface of the first gate insulating layer 150 disposed at a periphery of the groove 152. In an embodiment, a bottom surface of the insulating pattern 165 may contact the first gate insulating layer 150, and the top surface of the insulating pattern 165 may contact a bottom surface of the gate electrode pattern 185.

In an embodiment, the insulating pattern 165 may include a silicon compound, metal oxide, or the like. In an embodiment, the insulating pattern 165 may include $SiN_x$ having a relatively high dielectric constant. In some embodiments, the insulating pattern 165 may include metal oxide having a high dielectric constant. In an embodiment, the insulating pattern 165 may include $AlO_x$, $ZrO_x$, $HfO_x$, $TiO_x$, or the like, for example.

In an embodiment, as shown in FIGS. 13, 14, and 15, in a process of defining an opening 152 of the first gate insulating layer 150, while an etching process is performed to expose a second region b of the active layer 130, a preliminary first gate insulating layer 1150 disposed in the second region b may be excessively etched, for example, so that the second region b of the active layer 130 may be damaged.

In an embodiment, in order to prevent the second region b of the active layer 130 from being damaged in the etching process, only a portion of the preliminary first gate insulating layer 1150 disposed in the second region b may be removed so as not to expose the second region b of the active layer 130, so that the groove 152 may be defined in the first gate insulating layer 150. Accordingly, the display device 600 may function as a display device capable of reducing defects in the second region b of the active layer 130.

Figure 25:
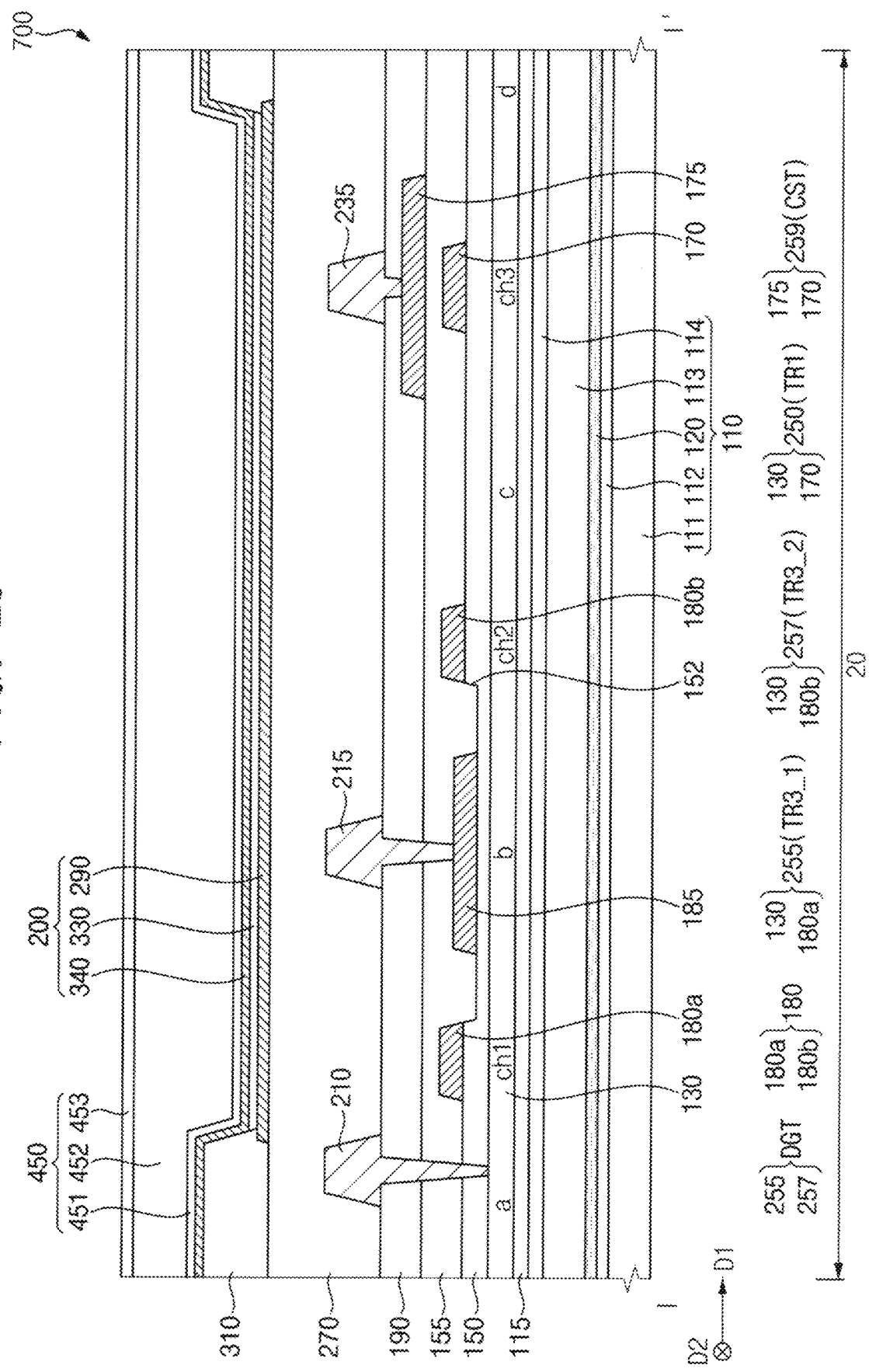
FIG. 25 is a cross-sectional view showing an embodiment of a display device according to the invention.

FIG. 25 is a cross-sectional view showing an embodiment of a display device according to the invention. A display device 700 illustrated in FIG. 25 may have a configuration that is substantially identical or similar to the configuration of the display device 100 described with reference to FIGS. 1 to 9 except for the shape of the first gate insulating layer 150. In FIG. 25, redundant descriptions of components that are substantially identical or similar to the components described with reference to FIGS. 1 to 9 will be omitted.

Referring to FIG. 25, the display device 700 may include a substrate 110, a buffer layer 115, a gate electrode pattern 185, a driving transistor 250, a dual gate transistor DGT, a storage capacitor 259, a first gate insulating layer 150, a second gate insulating layer 155, an inter-insulating layer 190, a connection pattern 215, a power supply wire 235, a connection electrode 210, a planarization layer 270, a light emitting structure 200, a pixel defining layer 310, a thin film encapsulation structure 450, or the like.

The first gate insulating layer 150 may be disposed on the buffer layer 115 and an active layer 130. In an embodiment, a groove 152 that overlaps a second region b may be defined in the first gate insulating layer 150. In an embodiment, the groove 152 may not overlap a first sub-gate electrode 180a and a second sub-gate electrode 180b, and may overlap the gate electrode pattern 185, for example.

The gate electrode pattern 185 may be disposed inside the groove 152. The gate electrode pattern 185 may be spaced apart from the first gate electrode 180. In an embodiment, since the gate electrode pattern 185 is disposed inside the groove 152, the gate electrode pattern 185 may be disposed in a layer that is different from a layer in which the first gate electrode 180 and the second gate electrode 170 are disposed. In addition, the gate electrode pattern 185 may contact the first gate insulating layer 150.

In an embodiment, since the gate electrode pattern 185 is disposed inside the groove 152 of the first gate insulating layer 150, a distance between the gate electrode pattern 185 and the second region b of the active layer 130 may be relatively reduced. Accordingly, a capacitance of a capacitor CAP may be relatively increased, and a leakage current may be further reduced in the second region b.

Figure 26:
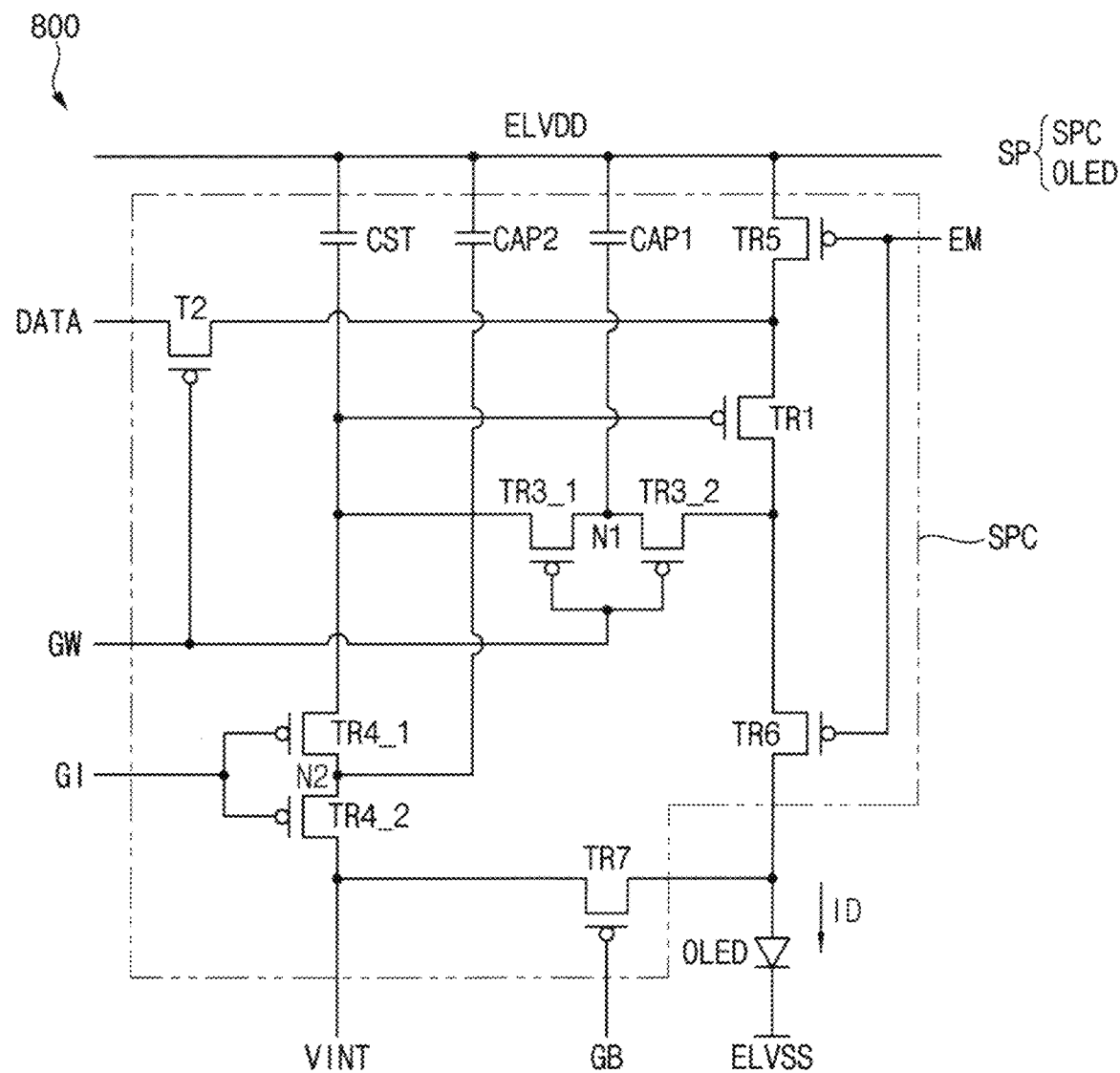
FIG. 26 is a circuit diagram showing an embodiment of a display device according to the invention.

FIG. 26 is a circuit diagram showing an embodiment of a display device according to the invention. A display device 800 illustrated in FIG. 26 may include a sub-pixel SP having a configuration that is substantially identical or similar to the configuration of the sub-pixel SP of the display device 100 described with reference to FIG. 2 except for a second capacitor CAP2. In FIG. 26, redundant descriptions of components that are substantially identical or similar to the components described with reference to FIG. 2 will be omitted.

Referring to FIG. 26, a sub-pixel SP may be disposed in each of sub-pixel areas 20 of the display device 800. The sub-pixel SP may include a sub-pixel circuit SPC and an organic light emitting diode OLED. In this case, the sub-pixel circuit SPC may include first to seventh transistors TR1, TR2, TR3_1, TR3_2, TR4_1, TR4_2, TR5, TR6, and TR7, a storage capacitor CST, a first capacitor CAP1, a second capacitor CAP2, wires, or the like, and the wires may include a wire to which a first power supply voltage ELVDD is applied, a wire to which a second power supply voltage ELVSS is applied, a wire to which an initialization voltage VINT is applied, a wire to which a data signal DATA is applied, a wire to which a gate signal GW is applied, a wire to which a gate initialization signal GI is applied, a wire to which an emission control signal EM is applied, a wire to which a diode initialization signal GB is applied, or the like. In addition, the sub-pixel circuit SPC may further include an active layer (e.g., the active layer 130 of FIG. 3) which connects the first to seventh transistors TR1, TR2, TR3_1, TR3_2, TR4_1, TR4_2, TR5, TR6, and TR7, the storage capacitor CST, the first capacitor CAP1, the second capacitor CAP2, or the like to each other.

The first capacitor CAP1 may include a first terminal and a second terminal. The first capacitor CAP1 may be connected between a first power supply voltage (ELVDD) wire and the third transistors TR3_1 and TR3_2 (e.g., to the first node N1). In an embodiment, the first terminal of the first capacitor CAP1 may be connected to a second terminal of the third transistor TR3_1 and a first terminal of the third transistor TR3_2, and the second terminal of the first capacitor CAP1 may be connected to the first power supply voltage (ELVDD) wire, for example.

The second capacitor CAP2 may include a first terminal and a second terminal. The second capacitor CAP2 may be connected between the first power supply voltage (ELVDD) wire and the fourth transistors TR4_1 and TR4_2 (e.g., to a second node N2). In an embodiment, the first terminal of the second capacitor CAP2 may be connected to a first terminal of the fourth transistor TR4_1 and a second terminal of the fourth transistor TR4_2, and the second terminal of the second capacitor CAP2 may be connected to the first power supply voltage (ELVDD) wire, for example.

A gate signal (GW) wire, a gate initialization signal (GI) wire, a data signal (DATA) wire, or the like may be disposed at a periphery of the second node N2, and a voltage of the second node N2 may fluctuate due to voltage variations of the gate signal (GW) wire, the gate initialization signal (GI) wire, and the data signal (DATA) wire. In an embodiment, the second node N2 and the second capacitor CAP2 may be connected to each other, so that a voltage fluctuation at the second node N2 that may be caused by the voltage variations of the gate signal (GW) wire, the gate initialization signal (GI) wire, and the data signal (DATA) wire disposed at a periphery of the second node N2 may be reduced.

Embodiments of the invention may be applied to various electronic devices including a display device. In an embodiment, the invention may be applied to numerous electronic devices such as vehicle-display devices, ship-display devices, aircraft-display devices, portable communication devices, exhibition display devices, information transfer display devices, medical-display devices, etc., for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the particular embodiments disclosed, and that modifications to the disclosed embodiments, as well as other embodiments, are intended to be included within the scope of the appended claims.

What is claimed is:

1. A display device comprising:
a substrate including a sub-pixel area;
an active layer disposed in the sub-pixel area on the substrate, the active layer including:
first, second, and third regions;
a first channel region disposed between the first and second regions; and
a second channel region disposed between the second and third regions;
a first gate electrode disposed in the first and second channel regions on the active layer, and constituting a dual gate transistor together with the first and second regions and the first channel region and together with the second and third regions and the second channel region;
a first gate insulating layer disposed between the active layer and the first gate electrode, and defining an opening which exposes the second region of the active layer;
an insulating pattern disposed in the opening;
a gate electrode pattern contacting a first surface of the insulating pattern opposite to a second surface of the insulating pattern facing the substrate, spaced apart from the first gate electrode, and constituting a capacitor together with the second region; and a light emitting structure disposed on the dual gate transistor and the gate electrode pattern.

2. The display device of claim 1, wherein the dual gate transistor is connected in series.

3. The display device of claim 1, wherein a dielectric constant of the insulating pattern is greater than a dielectric constant of the first gate insulating layer.

4. The display device of claim 1, further comprising:

a second gate insulating layer disposed on the first gate electrode and the gate electrode pattern;

an inter-insulating layer disposed on the second gate insulating layer; and a connection pattern disposed on the inter-insulating layer, and to which a first power supply voltage is applied.

5. The display device of claim 4, wherein the connection pattern is connected to the gate electrode pattern through a contact hole defined in the second gate insulating layer and the inter-insulating layer.

6. The display device of claim 1, wherein a gate signal is applied to the first gate electrode, and a first power supply voltage is provided to the gate electrode pattern.

7. The display device of claim 1, wherein the active layer further includes a fourth region and a third channel region disposed between the third and fourth regions, and the first region, the first channel region, the second region, the second channel region, the third region, the third channel region, and the fourth region are sequentially arranged.

8. The display device of claim 7, further comprising a second gate electrode disposed in the third channel region on the active layer, and constituting a driving transistor together with the third and fourth regions and the third channel region.

9. The display device of claim 8, wherein the first gate electrode, the gate electrode pattern, and the second gate electrode are disposed in a same layer.

10. The display device of claim 8, further comprising:

a third gate electrode disposed on the second gate electrode, and constituting a storage capacitor together with the second gate electrode;

an inter-insulating layer disposed on the third gate electrode; and a power supply wire disposed on the inter-insulating layer, to which a first power supply voltage is applied, and connected to the third gate electrode through a contact hole defined in the inter-insulating layer, wherein the first power supply voltage is provided to the third gate electrode.

11. The display device of claim 1, wherein the light emitting structure includes:

a first electrode;

a light emitting layer disposed on the first electrode; and a second electrode to which a second power supply voltage is applied.

* * * * *